United States Patent [19]

Iwahashi

[11] Patent Number: 4,613,957
[45] Date of Patent: Sep. 23, 1986

[54] SEMICONDUCTOR MEMORY DEVICE HAVING A SENSE AMPLIFIER CIRCUIT

[75] Inventor: Hiroshi Iwahashi, Yokohama, Japan

[73] Assignee: Tokyo Shibaura Denki Kabushiki Kaisha, Kawasaki, Japan

[21] Appl. No.: 514,350

[22] Filed: Jul. 15, 1983

[30] Foreign Application Priority Data

| Jul. 26, 1982 | [JP] | Japan | 57/129809 |
| Jul. 26, 1982 | [JP] | Japan | 57/129813 |
| Mar. 31, 1983 | [JP] | Japan | 58/56076 |
| Mar. 31, 1983 | [JP] | Japan | 58/56077 |
| Mar. 31, 1983 | [JP] | Japan | 58/56096 |

[51] Int. Cl.$^4$ .................. G11C 7/00; G11C 7/02; G01R 19/00
[52] U.S. Cl. .................. 365/189; 365/207; 307/530; 307/236
[58] Field of Search .................. 365/207, 208, 205, 94, 365/189; 307/530, 351, 352, 353, 355, 356, 358, 359, 236

[56] References Cited

U.S. PATENT DOCUMENTS

| 4,181,865 | 1/1980 | Kohyama | 365/205 |
| 4,223,394 | 9/1980 | Pathak et al. | 365/210 |
| 4,461,965 | 7/1984 | Chin | 307/530 |

Primary Examiner—Terrell W. Fears
Assistant Examiner—Guy M. Miller
Attorney, Agent, or Firm—Finnegan, Henderson, Farabow, Garrett & Dunner

[57] ABSTRACT

A semiconductor memory device has a memory circuit with a plurality of memory cells, a data transmission line for transmitting the data from the memory circuit, and a data detection circuit for detecting the memory data supplied through the data transmission line. The data detection circuit produces output data in accordance with the direction of change in logic level of the memory data supplied through the data transmission line.

6 Claims, 49 Drawing Figures

F I G. 22
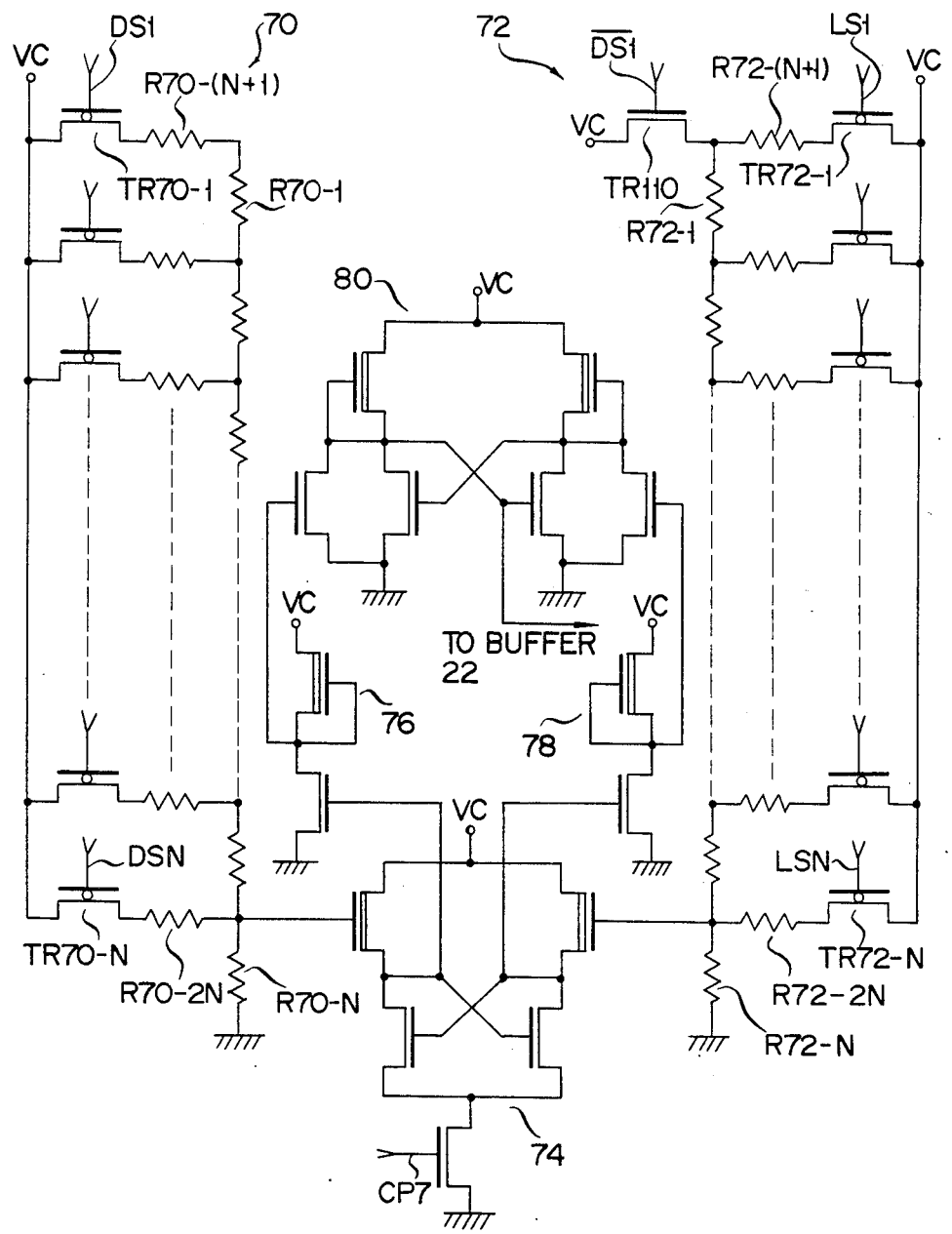

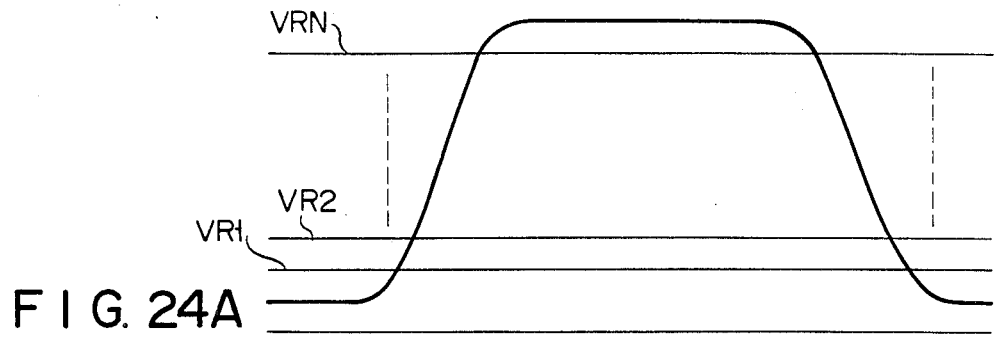
FIG. 24A
FIG. 24B
FIG. 24C
FIG. 25
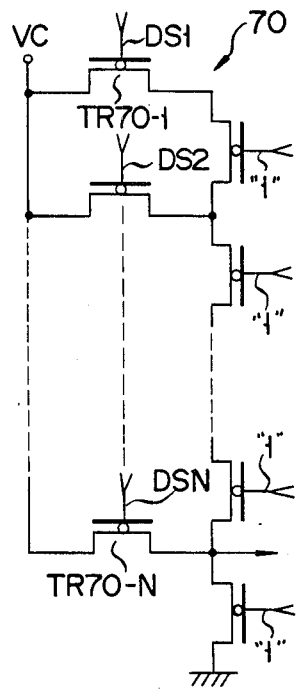
FIG. 26
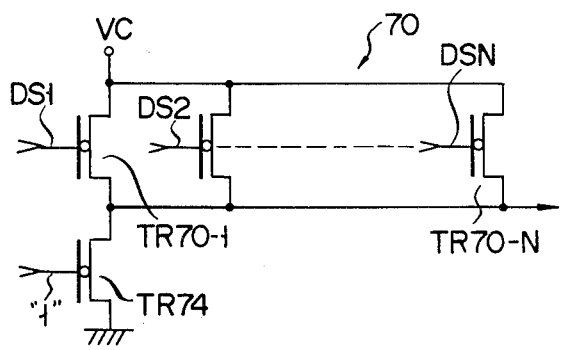

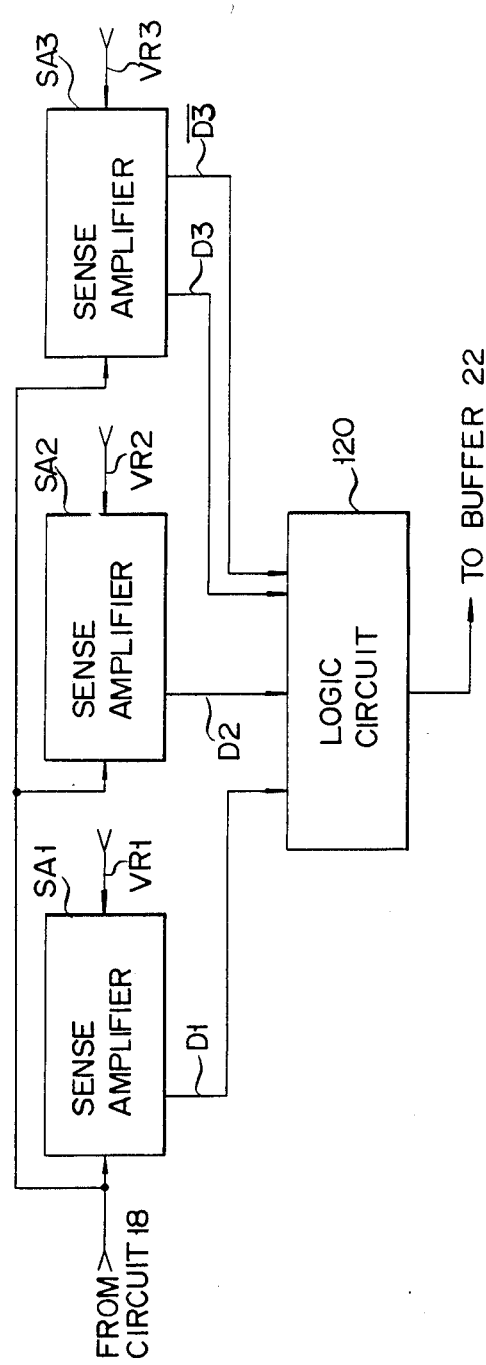
F I G. 29

SEMICONDUCTOR MEMORY DEVICE HAVING A SENSE AMPLIFIER CIRCUIT

BACKGROUND OF THE INVENTION

The present invention relates to a semiconductor memory device.

Since a differential sense amplifier can, in general, operate stably and detect a small potential difference between input signals, it is frequently used in semiconductor memory devices. In a random-access memory (RAM), signals of two states which have an inverted relationship and represent the memory data read out from memory cells are supplied to a pair of input terminals of a differential sense amplifier through a pair of data lines. On the other hand, in a read-only memory (ROM), the memory data read out from memory cells are supplied through a single data line to a first input terminal of a differential sense amplifier which has a second input terminal connected to receive a reference potential signal from a dummy cell.

FIG. 1 shows a conventional mask ROM device formed of MOS transistors manufactured by the n-channel process. The ROM device includes a memory section 10, row and column decoders 12 and 14 coupled to the memory section 10, a differential sense amplifier 16, a data transmission circuit 18 which serves as a load circuit of the memory cells and which supplies the data read out from the memory section 10 to the first input terminal of the differential sense amplifier 16, a reference potential generator 20 for supplying a reference potential to the second input terminal of the differential sense amplifier 16, and an output buffer circuit 22 for generating an output signal corresponding to the output signal from the differential sense amplifier 16.

The memory section 10 includes, for example, a plurality of MOS transistors MC-11 to MC-MN which constitute memory cells respectively storing data "0" or "1" and which are arranged in a matrix form, and data line selection MOS transistors ST1 to STN, one end of each of which is connected to a corresponding one of digital lines DL1 to DLN of the matrix array of memory cells and the other ends of which are commonly connected.

The data transmission circuit 18 has a series circuit of resistors R1 and R2, which is connected between a power source terminal VC and ground; enhancement-type (E-type) MOS transistors TR1 and TR2, whose gates are connected to a connection point or node between the resistors R1 and R2, and one end of the current path of each of which is connected to the output terminal of the memory section 10; and a depletion-type (D-type) MOS transistor TR3, the gate and one end of the current path of which are connected to the other end of the current path of the MOS transistor TR2. The other end of the current path of each of the MOS transistors TR1 and TR3 is coupled to the power source terminal VC. The potential at the connection point between the MOS transistors TR2 and TR3 is transmitted to the first input terminal of the differential sense amplifier 16 as a data signal.

The reference potential generator 20 has resistors R3 and R4, E-type MOS transistors TR4 and TR5 and a D-type MOS transistor TR6, which have the same arrangement and connections as those of the resistors R1 and R2 and the MOS transistors TR1, TR2 and TR3. One end of the current path of each of the MOS transistors TR4 and TR5 is grounded through an MOS transistor TR7 of a similar arrangement as the MOS transistors ST1 to STN, and an MOS transistor TR8 of a similar arrangement as the MOS transistors MC-11 to MC-MN. A signal of logic level "1", that is, a voltage of a potential level equal to that at the gate of a selected data line selection MOS transistor, is supplied to the gate of the MOS transistor TR7. The gate of the MOS transistor TR8 receives an output voltage from a voltage divider formed of a series circuit of resistors R5 and R6 connected between the power source terminal VC and ground. The potential at the connection point between the MOS transistors TR5 and TR6 is supplied as the reference potential signal to the second input terminal of the sense amplifier 16.

In response to well known chip enable signals CE and $\overline{CE}$, the sense amplifier 16 detects the difference between first and second input voltages V1 and V2, respectively applied to the first and second input terminals thereof, and supplies an output signal corresponding to this difference to the output buffer circuit 22.

The MOS transistors MC-11 to MC-MN of the memory section 10 have a high or low threshold voltage in accordance with the data to be stored. When an MOS transistor having, for example, a high threshold voltage is selected, it is kept OFF. Thus, the data line connected to this selected MOS transistor is charged, and the gradually increasing potential on this data line is supplied to the first input terminal of the sense amplifier 16. However, when an MOS transistor having a low threshold voltage is selected, this MOS transistor is turned on and the data line connected thereto is discharged. As shown in FIG. 2, in accordance with the stored data in the selected memory cell or the threshold voltage of the selected MOS transistor, a first input voltage V1 supplied to the first input terminal of the sense amplifier 16 gradually increases or decreases. Since a reference potential of substantially constant level is generated by the reference potential generator 20, a second input voltage V2 of a substantially constant level as shown in FIG. 2 is supplied to the second input terminal of the sense amplifier 16.

When the first input voltage V1, which increases or decreases in accordance with the charge/discharge operation of the data line, crosses the second input voltage V2, as shown in FIG. 2, the output signal from the sense amplifier 16 is inverted. An output signal V0 from the output buffer circuit 22 is also inverted as indicated by the broken line in FIG. 2. Thus, the readout speed of the memory data is largely dependent on the charge/discharge time. Therefore, various measures have been taken to shorten the charge/discharge time of the data line in an attempt to increase the readout speed of the memory data. However, improvements attainable with such measures are limited.

SUMMARY OF THE INVENTION

It is, therefore, an object of the present invention to provide a semiconductor memory device which allows readout of memory data at high speed.

The above and other objects of the present invention are achieved by a semiconductor memory device comprising a memory circuit having a plurality of memory cells, a data transmission line for transmitting data from the memory circuit, and a data detection circuit for detecting the direction of change in logic level of the memory data supplied through the transmission line and producing output data in accordance with the detection result.

According to the semiconductor memory device of the present invention, data from the memory circuit can be easily determined by detecting whether the potential on the data transmission line is increasing or decreasing. Accordingly, the data from the memory circuit may be read out at high speed.

BRIEF DESCRIPTION OF THE DRAWINGS

FIG. 22 is a circuit diagram of the comparator shown in FIG. 20;

FIGS. 23A to 23C and FIGS. 24A to 24C show signal waveforms for explaining the operation of the data readout section shown in FIG. 22;

FIGS. 25 and 26 respectively show modifications of the first voltage generator shown in FIG. 22;

FIG. 29 is a block diagram of a data readout section of a semiconductor memory device according to still another embodiment of the present invention;

DETAILED DESCRIPTION OF THE PREFERRED EMBODIMENTS

Figure 1:
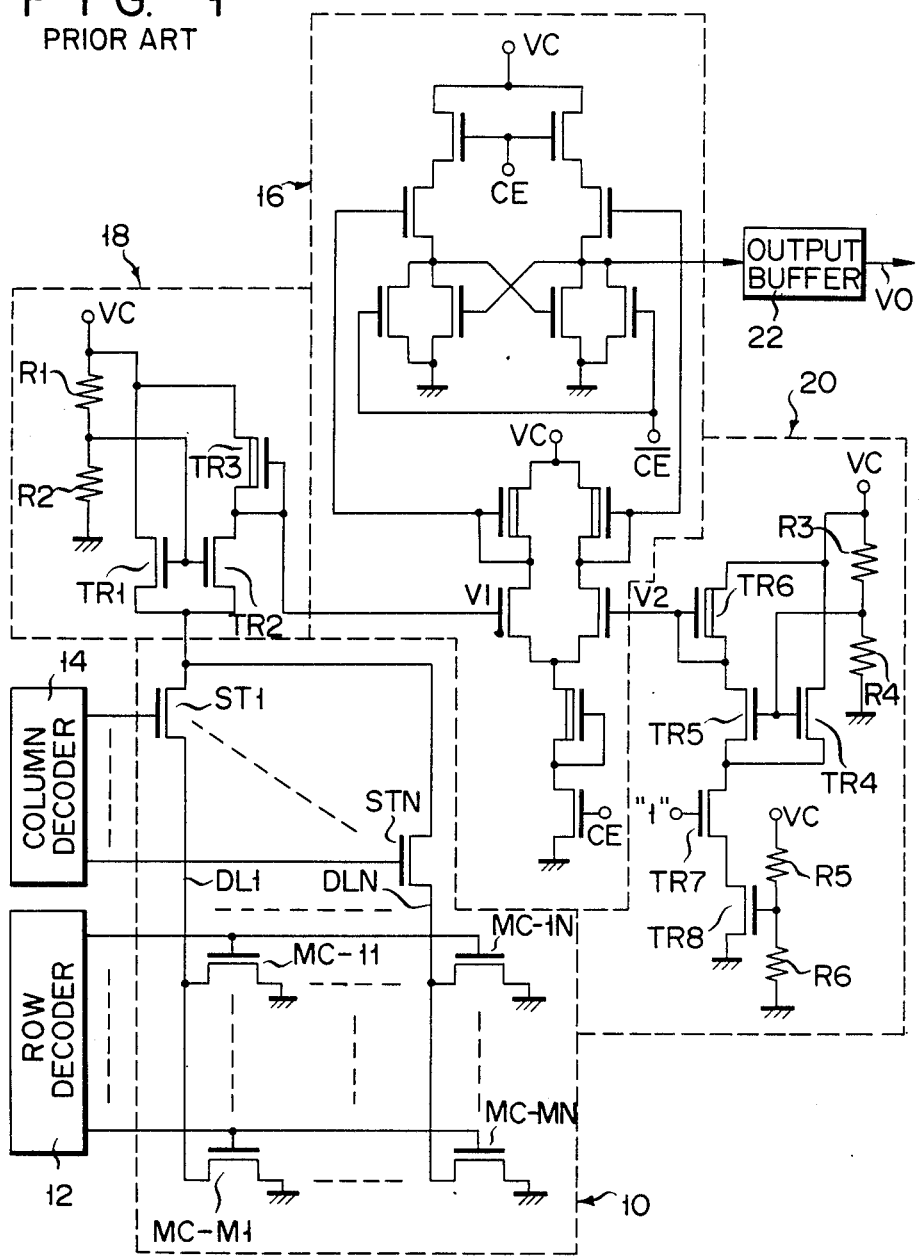
FIG. 1 is a circuit diagram of a conventional ROM device.
Figure 2:
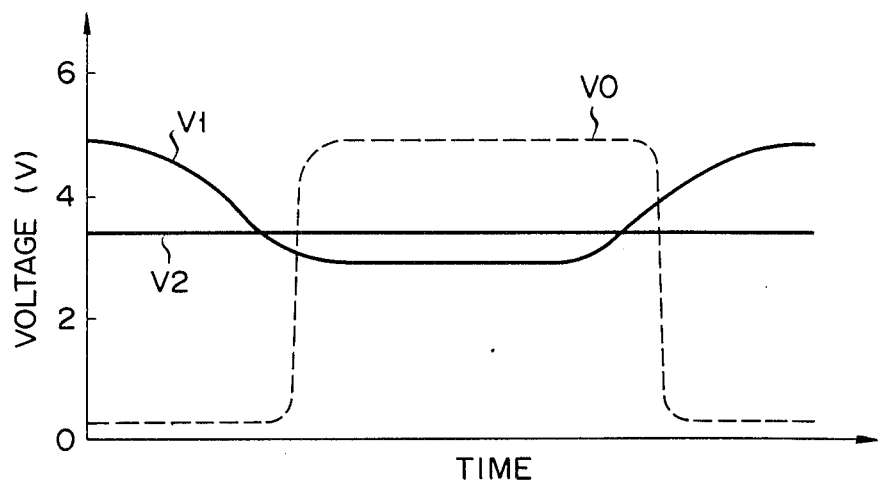
FIG. 2 shows a signal waveform for explaining the operation of the ROM device shown in FIG. 1.
Figure 3:
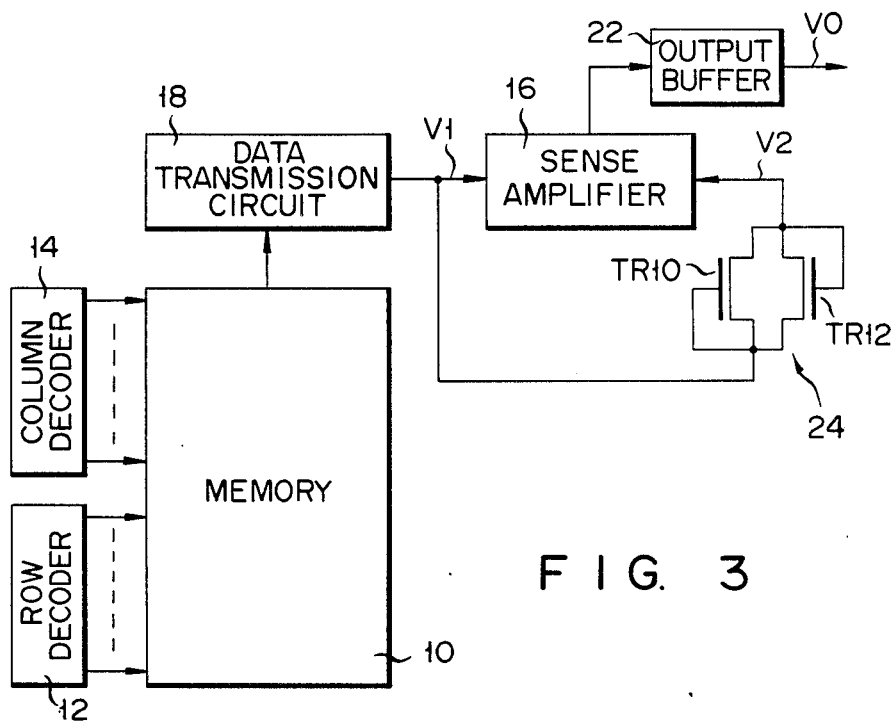
FIG. 3 is a block diagram of a semiconductor memory device according to an embodiment of the present invention.

FIG. 3 shows an embodiment of a semiconductor memory device according to the present invention. The semiconductor memory device is substantially the same as that shown in FIG. 1 except that in place of the reference potential generator 20 a transistor circuit 24 is used which serves as a voltage difference generator and which is coupled between the output terminal of a data transmission circuit 18 and the second input terminal of a differential sense amplifier 16. The transistor circuit 24 has an E-type MOS transistor TR10, the gate and one end of the current path of which are connected to the output terminal of the data transmission circuit 18, and the other end of the current path of which is connected to the second input terminal of the sense amplifier 16; and another E-type MOS transistor TR12, the gate and one end of the current path of which are connected to the second input terminal of the sense amplifier 16, and the other end of the current path of which is connected to the output terminal of the data transmission circuit 18.

Figure 4:
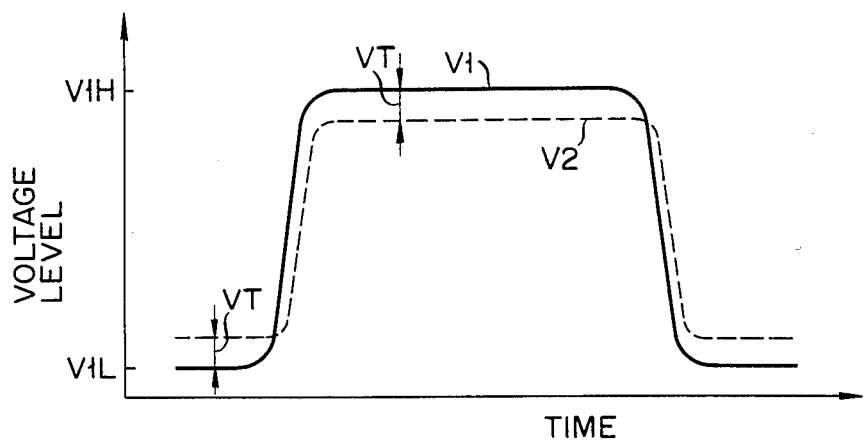
FIG. 4 shows a signal waveform for explaining the operation of the semiconductor memory device shown in FIG. 3.

The operation of the semiconductor memory device shown in FIG. 3 will now be described with reference to the voltage waveform shown in FIG. 4.

A case will be considered wherein a memory cell storing data "0" is selected and an output voltage V1L of logic level "0" is generated by the data transmission circuit 18. In this case, the second input voltage V2 indicated by the broken line in FIG. 4 is discharged in the direction toward the voltage level V1L through the MOS transistor TR12 and is held at a voltage level higher than the first input voltage V1 (indicated by the solid line) by a threshold voltage VT of the MOS transistor TR12. When a memory cell storing data "1" is selected in this condition, an output voltage from the data transmission circuit 18, that is, the first input voltage V1, gradually increases, as has been described earlier. When the first input voltage V1 becomes higher than the second input voltage V2, that is, when the first input voltage V1 becomes higher than the voltage level V1L by the threshold voltage VT, the output signal from the sense amplifier 16 is inverted. Thus, the readout speed from a memory section 10 is significantly improved.

When the first input voltage V1 further increases to become higher than the second input voltage V2 by a threshold voltage VT of the MOS transistor TR10, the second input voltage V2 is charged in the direction toward the first input voltage V1 through the MOS transistor TR10 and increases as the first input voltage increases while the difference between the first and second input voltages V1 and V2 is kept at VT. When the first input voltage V1 is held at the voltage level V1L thereafter, the second input voltage V2 is set at a level lower than the first input voltage V1 by the threshold level VT. When a memory cell storing data "0" is selected next, the first input voltage V1 gradually decreases. When the first input voltage V1 becomes lower than the second input voltage V2, that is, when the first input voltage V1 becomes lower than the voltage level V1L by the threshold voltage VT, the output signal from the sense amplifier 16 is inverted.

When the first input voltage V1 further decreases and becomes lower than the second input voltage V2 by the threshold voltage VT, the second input voltage V2 is discharged in the direction toward the first input voltage V1 through the MOS transistor TR12, and decreases as the first input voltage V1 decreases, while the difference between the first and second input voltages V1 and V2 is kept at the threshold voltage VT.

In the embodiment shown in FIG. 3, the first and second potential signals corresponding to voltage levels of an output voltage from the data transmission circuit 18 at two different time points are supplied to the sense amplifier 16. In this case, for example, the first potential signal is (V1L+VT), and the second potential signal is the first input voltage V1 which increases from the voltage level V1L.

Figure 5:
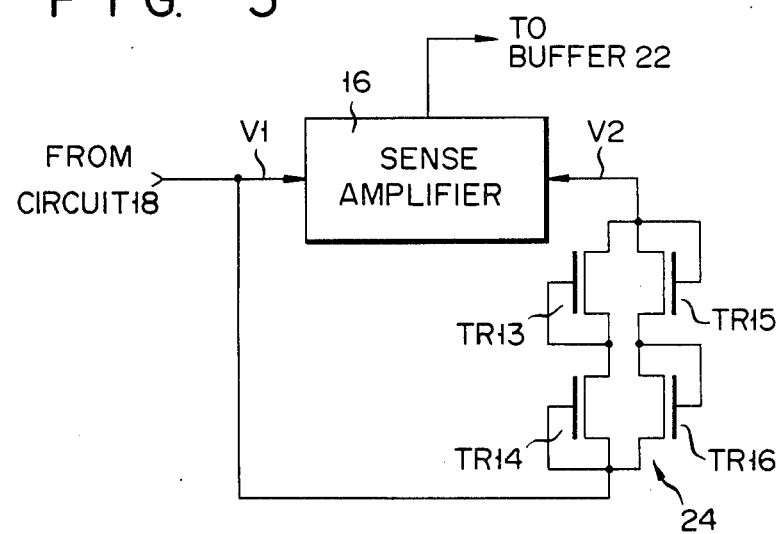
FIG. 5 shows a modification of the data readout section shown in FIG. 3.

FIG. 5 is a circuit diagram of a modification of the data readout section including the sense amplifier 16 and the transistor circuit 24 shown in FIG. 3. Referring to FIG. 5, the transistor circuit 24 has an MOS transistor TR13, one end of the current path of which is connected to the second input terminal of the sense amplifier 16; an MOS transistor TR14, one end of the current path of which is connected to the gate of the MOS transistor TR13 and to the other end of the current path of the MOS transistor TR13, and the gate and the other end of the current path of which are connected to the output terminal of the data transmission circuit 18; an MOS transistor TR15, the gate and one end of the current path of which are connected to the second input terminal of the sense amplifier 16; and an MOS transistor TR16, the gate and one end of the current path of which are connected to the other end of the current path of the MOS transistor TR15, and the other end of the current path of which is connected to the output terminal of the data transmission circuit 18.

When the transistor circuit 24 shown in FIG. 5 is used, the voltage difference between the first and second input voltages V1 and V2 may be set to be 2VT. In this manner, the voltage difference between the input voltages V1 and V2 may be freely set in accordance with the process conditions and the operation characteristics of the memory section 10, the sense amplifier 16 and the like.

Figure 6:
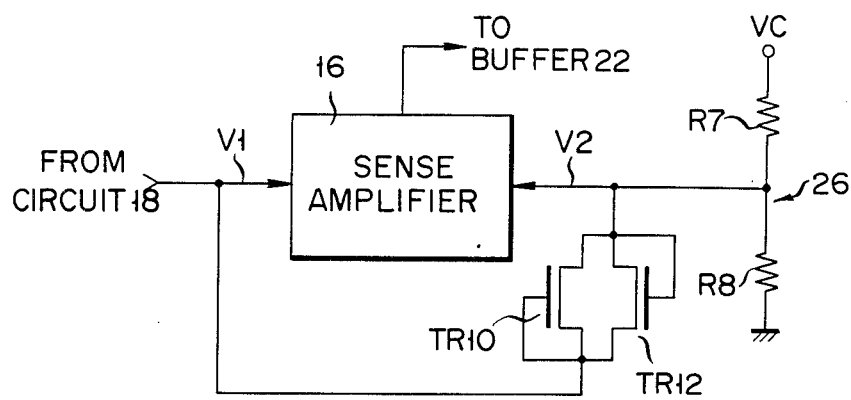
FIG. 6 shows the data readout section shown in FIG. 3 with a voltage divider circuit added thereto.

FIG. 6 shows a block diagram of the data readout section of the semiconductor memory device shown in FIG. 3 together with a potential setting circuit 26. The potential setting circuit 26 includes a series circuit of resistors R7 and R8 connected between the power source terminal VC and ground, and the output terminal of the potential setting circuit 26 is connected to the second input terminal of the sense amplifier 16.

When the input voltages of the level V1L and the level (V1L+VT) are respectively applied to the first and second input terminals of the sense amplifier 16 in the semiconductor memory device shown in FIG. 3, the MOS transistors TR10 and TR12 are OFF. Therefore, the second input terminal of the sense amplifier 16 is placed in an electrically floating condition. In this case, as time elapses, a leakage current may flow through the MOS transistors TR10 and TR12 or through a p-n junction, and the input voltage V2 drops toward the level V1L.

In the circuit shown in FIG. 6, when the input voltage V1 is at the level V1L, a current flows through the resistor R7 and the MOS transistor TR12, so that the input voltage V2 is substantially held at the level (V1L+VT). When the input voltage V1 is at the level V1L, a current flows through the MOS transistor TR10 and the resistor R8, and the input voltage V2 is also held at substantially the level (V1H+VT).

Figure 7:
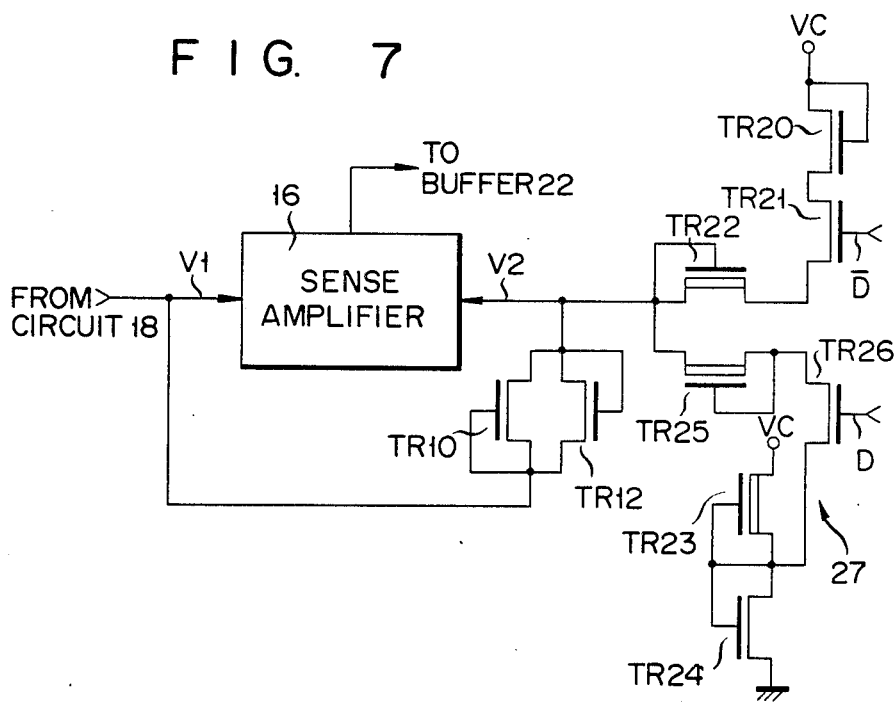
FIG. 7 shows the data readout section shown in FIG. 3 with a potential setting circuit added thereto.

FIG. 7 shows a circuit similar to that shown in FIG. 6 except that a potential setting circuit 27 is used in place of the potential setting circuit 26 shown in FIG. 6. The potential setting circuit 27 includes a series circuit of MOS transistors TR20, TR21 and TR22 connected between the power source terminal VC and the second input terminal of the sense amplifier 16, a series circuit of MOS transistors TR23 and TR24 connected between the power source terminal VC and ground, and a series circuit of MOS transistors TR25 and TR26 connected between the second input terminal of the sense amplifier 16 and the connection point between the MOS transistors TR23 and TR24. The gate of the MOS transistor TR20 is connected to the power source terminal VC, the gate of the MOS transistor TR22 is connected to the second input terminal of the sense amplifier 16, the gate of the MOS transistor TR25 is connected to the connection point between itself and the MOS transistor TR26, and the gates of the MOS transistors TR23 and TR24 are connected to the connection point between the MOS transistors TR23 and TR24. A data signal D is applied to the gate of the MOS transistor TR26, and a data signal $\overline{D}$ is applied to the MOS transistor TR21. The MOS transistors TR20, TR21, TR24 and TR26 are E-type, while the MOS transistors TR22, TR23 and TR25 are D-type.

When the input voltage V1 is at the level V1L, that is, when the data signals D and $\overline{D}$ are at logic levels "0" and "1", respectively, the MOS transistors TR21 and TR26 are respectively ON and OFF. Thus, a current flows through the MOS transistors TR20, TR21, TR22 and TR12 and sets the input voltage V2 at the level (V1L+VT). It is to be noted that the conduction resistance of the MOS transistor TR22 is set to be high enough that the rate of increase of the input voltage V1 from the level V1L to the level V1H is greater than the rate of increase of the input voltage V2 due to the current flowing through the MOS transistors TR20, TR21, and TR22.

When the data signals D and $\overline{D}$ are at logic levels "1" and "0", respectively, the MOS transistors TR21 and TR26 become OFF and ON. Then, a current flows through the MOS transistors TR10, TR25, TR26 and TR24, and sets the input voltage V2 at the level (V1L+VT). It is to be noted that the conduction resistance of the MOS transistor TR25 is set to be high enough that the rate of decrease of the input voltage V1 from the level V1H to the level V1L is greater than the rate of decrease of the input voltage V2 due to the current flowing through the MOS transistors TR25, TR26 and TR24. The potential at the connection point between the MOS transistors TR23 and TR24 is set to be substantially constant at the threshold voltage of the MOS transistor TR24. When the input voltage V1 is set at the level V1L upon turning on power, the input voltage V2 can be set at the level (V1L+VT). Assume that the input voltage V1 is at the level V1L upon turning on power and the input voltage V2 is also at the level V1L due to the high conduction resistances of the MOS transistors TR22 and TR25. In this case, since the input voltages V1 and V2 to the sense amplifier 16 are set at the same level, the logic level "1" or "0" of the data signal D is determined by, for example, variations in the threshold voltage of the MOS transistors constituting the sense amplifier 16 and the like. When the data signals D and $\overline{D}$ of logic levels "0" and "1" are generated, the MOS transistor TR21 is ON, and the input voltage V2 is set at the level (V1L+VT). On the other hand, when the data signals D and $\overline{D}$ of logic levels "1" and "0" are generated, the MOS transistors TR21 and TR26 are OFF and ON, respectively, and the input voltage V2 is set at the potential at the connection point between the MOS transistors TR23 and TR24. In this case, if the potential at the connection point between the MOS transistors TR23 and TR24 is so determined that the input voltage V2 may be set higher than the input voltage V1, the data signals D and $\overline{D}$ of logic levels "0" and "1" are generated. As a result, the MOS transistor TR21 is turned on, and the MOS transistor TR26 is turned off, so that the input voltage V2 is set at the level (V1L+VT).

Figure 8:
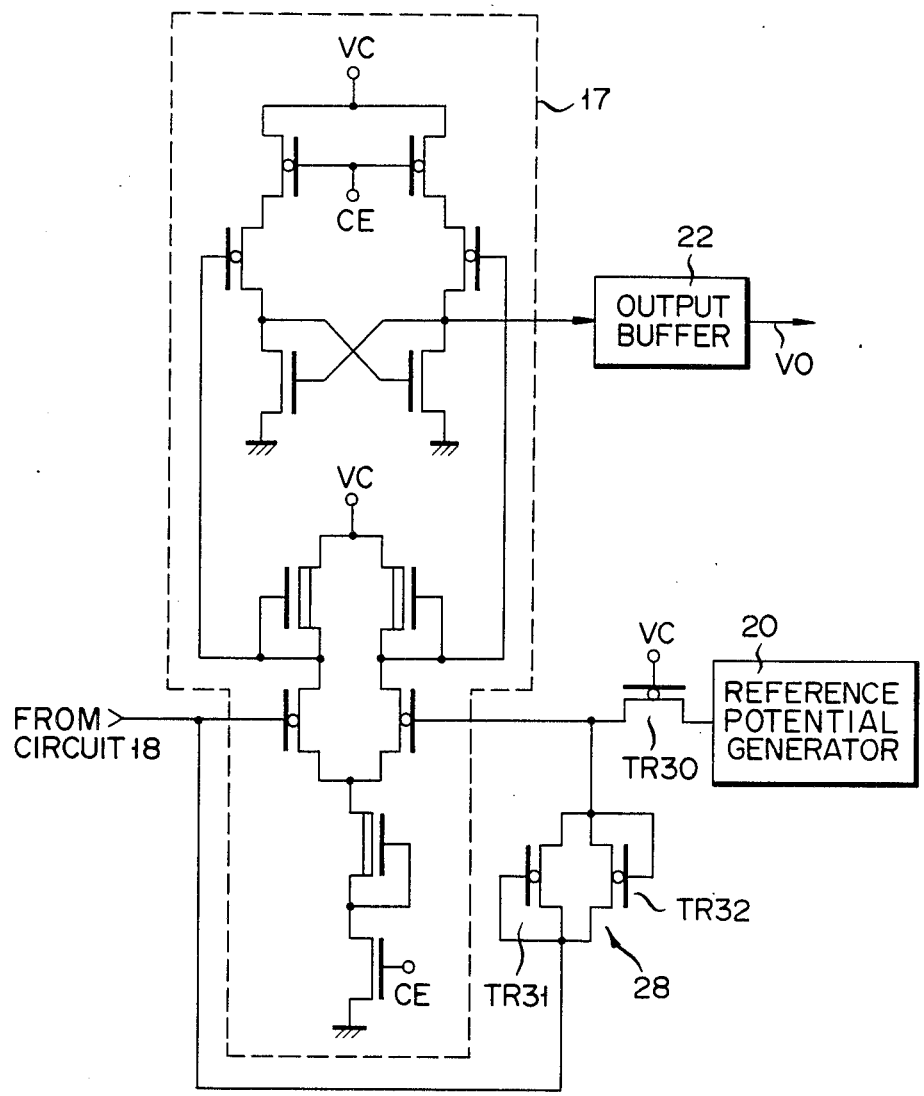
FIG. 8 is a circuit diagram of a data readout section of a semiconductor memory device according to another embodiment of the present invention.

FIG. 8 is a circuit diagram of a data readout section of a semiconductor memory device according to another embodiment of the present invention. The semiconductor memory device is essentially the same as that shown in FIG. 3 except for the portion shown in FIG. 8. A data signal from a data transmission circuit 18 is supplied to the first input terminal of a differential sense amplifier 17 and is also supplied to the second input terminal of the sense amplifier 17 through a transistor circuit 28. The second input terminal of the sense amplifier 17 also receives an output signal from a reference potential generator 20 through an MOS transistor TR30. The transistor circuit 28 includes a series circuit of MOS transistor TR31 and TR32 connected between the data transmission circuit 18 and the second input terminal of the sense amplifier 17. The gates of the MOS transistors TR31 and TR32 are respectively connected to the output terminal of the data transmission circuit 18 and to the second input terminal of the sense amplifier 17. The MOS transistors TR30, TR31 and TR32 have a threshold voltage which is nearly 0 V. The sense amplifier 17 operates in a substantially similar manner to that of the sense amplifier 16 shown in FIG. 1 except that the MOS transistors whose gates are connected to receive the first and second input voltages V1 and V2 have a threshold voltage of nearly 0 V, as in the case of the MOS transistors TR30, TR31 and TR32.

A case will now be considered wherein the first input voltage V1 is at the level V1L. In this case, the second input voltage V2 is set at a voltage level V2L given by the following equation:

$$V2L = \{(VP - V1L)/(RS + RF)\} \times RS + V1L \quad (1)$$

where RF and RS respectively denote the resistance of the MOS transistor TR30 and the forward resistance of the MOS transistor TR31 or TR32, and VP is the output potential level of the reference potential generator 20.

When the first input voltage V1 is at the level V1H, the second input voltage V2 is set at a voltage level V2H given by the following equation:

$$V2H = \{(V1H - VP)/(RS + RF)\} \times RF + VP \quad (2)$$

From the equations (1) and (2), potential differences ΔV1 (=V2L−V1L) and ΔV2 (=V1H−V2H) are respectively given by the following equations:

$$\Delta V1 = \{(VP - V1L)/(RS + RF)\} \times RS \quad (3)$$

$$\Delta V2 = \{(V1H - VP)/(RS + RF)\} \times RS \quad (4)$$

As may be seen from the equations (3) and (4) above, when the resistances RS and RF and the voltage levels V1L, V1H and VP are set appropriately, the potential differences ΔV1 and ΔV2 may be set to be sufficiently small.

As may be seen from the above, the MOS transistors TR31 and TR32 may be replaced by a MOS transistor whose source and drain are connected to the first and second input terminals of the sense amplifier 17, or by a resistor of polysilicon, for example, whose two ends are connected to the first and second input terminals of the sense amplifier 17.

Figure 9:
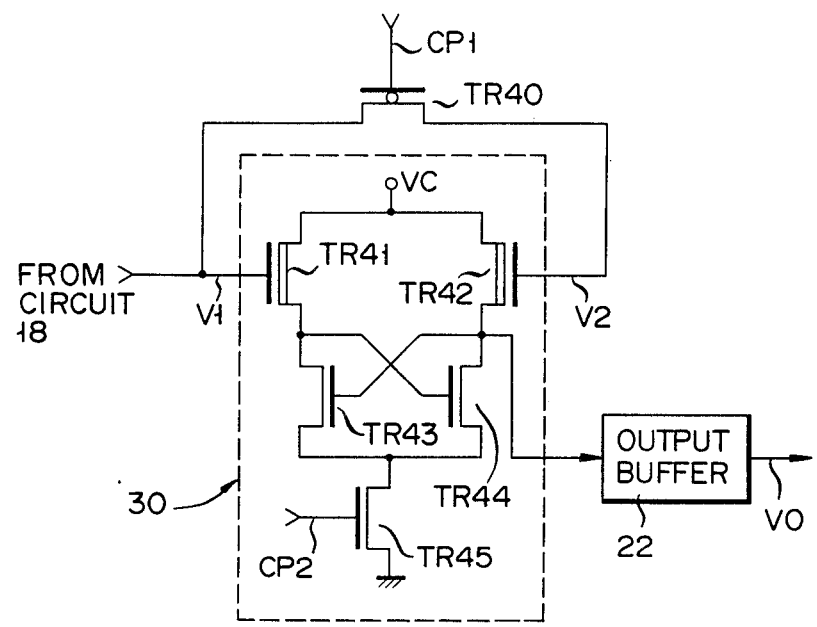
FIG. 9 is a circuit diagram of a data readout section of a semiconductor memory device according to still another embodiment of the present invention.

FIG. 9 shows a block diagram of part of a semiconductor memory device according to still another embodiment of the present invention. A data signal from a data transmission circuit 18 is directly supplied to the first input terminal of a differential sense amplifier 30 and is also supplied to the second input terminal thereof through an MOS transistor TR40 having a threshold voltage of about 0 V. The sense amplifier 30 has input MOS transistors TR41 and TR42, drive MOS transistors TR43 and TR44, and an MOS transistor TR45 coupled between a ground and one end of each of the current paths of the drive MOS transistors TR43 and TR44. A data signal from the data transmission circuit 18 is supplied to the gate of the input MOS transistor TR41 as well as to the gate of the input MOS transistor TR42 through the MOS transistor TR40.

Figure 10A:
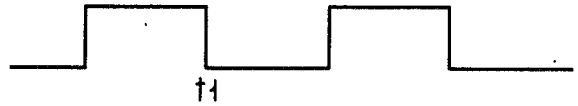
FIGS. 10A and 10B show signal waveforms for explaining the operation of the data readout section shown in FIG. 9.
Figure 10B:
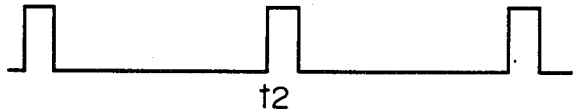

Clock signals CP1 and CP2 shown in FIGS. 10A and 10B are respectively supplied to the gates of the MOS transistors TR40 and TR45.

When the clock signal CP1 is at a high level, the MOS transistor TR40 is ON, and a data signal from the data transmission circuit 18 is supplied to the gates of the MOS transistors TR41 and TR42. When the clock signal CP1 goes low at time t1, the second input voltage V2 is set at a voltage level at time t1 and held at the same voltage level by the stray capacitance associated with a line connecting the MOS transistors TR40 and TR42. Thereafter, when the clock signal CP2 goes high at time t2, the MOS transistor TR45 is turned on, and the sense amplifier 30 is activated. Then, the sense amplifier 30 amplifies the difference between the input voltages V1 and V2, and supplies a corresponding output signal to the output buffer circuit 22. The output buffer circuit 22 latches the output signal from the sense amplifier 30 until the next signal is received.

A case will be considered wherein the data signal from the data transmission circuit 18 goes from logic level "0" to logic level "1". In this case, the voltage level of a data signal generated from the data transmission circuit 18 at time t2 becomes higher than that at time t1. The sense amplifier 30 detects the level difference between these data signals respectively at times t1 and t2. In case the data signal from the data transmission circuit 18 falls from logic level "1" to logic level "0", the voltage level of the data signal at time t2 becomes lower than that at time t1.

In this manner, since changes in the data signal within the short time period between times t1 and t2 may be detected, the memory data may be read out at high speed.

Figure 11:
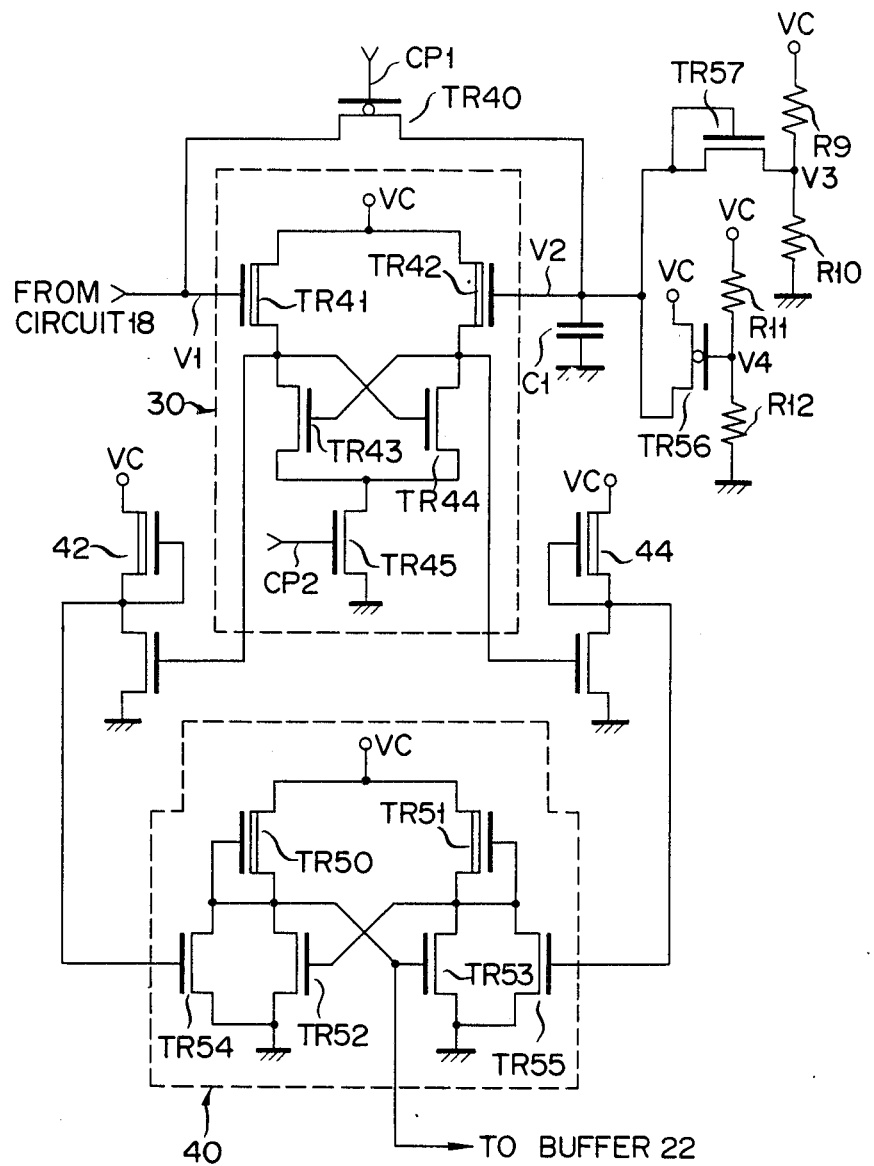
FIG. 11 is a circuit diagram of a data readout section of a semiconductor memory device according to still another embodiment of the present invention together with a latch circuit.

FIG. 11 shows a modification of the circuit shown in FIG. 9. In this modification, output signals which are inverted with respect to each other and which are produced from a differential sense amplifier 30 are supplied to a latch circuit 40 through inverters 42 and 44, respectively. The latch circuit 40 includes a flip-flop circuit formed of load MOS transistors TR50 and TR51 and drive MOS transistors TR52 and TR53, and input MOS transistors TR54 and TR55 which are connected in parallel with the MOS transistors TR52 and TR53, respectively.

In the modification shown in FIG. 11, the second input terminal of the sense amplifier 30 is grounded through a capacitor C1, coupled to a power source terminal VC through a MOS transistor TR56 having a threshold voltage of about 0 V, and coupled, through an MOS transistor TR57, to the output terminal of a voltage divider circuit formed of resistors R9 and R10. The output terminal of a voltage divider circuit formed of resistors R11 and R12 is coupled to the gate of the MOS transistor TR56.

In response to a clock signal CP2, the sense amplifier 30 detects the difference between the input voltages V1 and V2, and supplies corresponding output data to the latch circuit 40 through the inverters 42 and 44. The latch circuit 40 latches the output data from the sense amplifier 30 and supplies the corresponding output signal to the output buffer 22 even after the clock signal CP2 falls to a logic level "0".

In the circuit shown in FIG. 9, when the memory data is read out and a certain time period has elapsed, the output signal from the data transmission circuit 18 is set at a maximum voltage level V1H or a minimum voltage level V1L. Even if the clock signal CP1 falls thereafter, since the input voltages V1 and V2 remain at the same level, the sense amplifier 30 cannot produce an output signal corresponding to the memory data. In order to solve such a problem, in the circuit shown in FIG. 11, the resistors R9 to R12 and the MOS transistors TR56 and TR57 are used.

A potential V3 at the connection point between the resistors R9 and R10 is set at a voltage level which is lower than the maximum voltage level V1H of the input voltage V1 by the sum of a predetermined voltage and the threshold voltage of the MOS transistor TR57. Accordingly, when the input voltage V1 is at the maximum voltage level V1H to turn off the MOS transistor TR40, the input voltage V2 decreases toward the potential V3 through the MOS transistor TR57. In this manner, the input voltage V2 is set at a potential level lower than the input voltage V1, and the sense amplifier 30 produces an output signal corresponding to a data signal from the data transmission circuit 18.

A potential V4 at the connection point between the resistors R11 and R12 is set at a voltage level which is higher than the minimum voltage V1L of the input voltage V1 by a predetermined voltage. Accordingly, when the input voltage V1 is at the minimum voltage level V1L to turn off the MOS transistor TR40, the input voltage V2 increases toward the potential level V4 through the MOS transistor TR56. Thus, the input voltage V2 becomes higher than the input voltage V1, and the sense amplifier 30 generates an output signal corresponding to the data signal from the data transmission circuit 18.

When the MOS transistor TR40 is ON and the input voltage V1 is at the minimum voltage level V1L, a current flows through the MOS transistors TR56 and TR40. Thus, the input voltage V1 becomes lower than the input voltage V2. When the input voltage V1 is at the maximum voltage level V1H, a current flows through the MOS transistors TR40 and TR57 and the resistor R10, so that the input voltage V1 becomes higher than the input voltage V2.

Figure 12A:
FIGS. 12A to 12D and FIGS. 13A to 13D show signal waveforms for explaining the operation of the data readout section shown in FIG. 11.
Figure 12B:
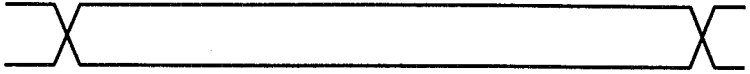
Figure 12C:
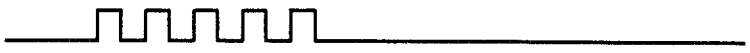
Figure 12D:

For example, when a chip enable signal $\overline{CE}$ becomes low, as shown in FIG. 12A, and the address signal changes as shown in FIG. 12B so as to read data from a newly selected memory cell, the clock signals CP1 and CP2 are generated for predetermined periods as shown in FIGS. 12C and 12D and are thereafter set at a low level. This is because the data detected by the sense amplifier 30 is latched by the latch circuit 40, and the latched data in the latch circuit 40 can be stably generated even if the clock signals CP1 and CP2 are both kept at a low level.

Referring to FIGS. 13A to 13D, the operation of the circuit shown in FIG. 11 after the data signal from the data transmission circuit 18 goes high or low will now be described.

Figure 13A:
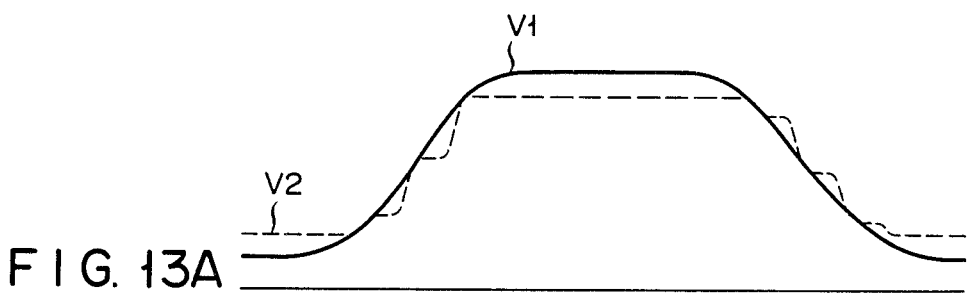
Figure 13B:
Figure 13C:
Figure 13D:

When the data signal from the data transmission circuit 18 is at a low level, the input voltage V2 is set to be higher than the input voltage V1 by a predetermined voltage, as shown in FIG. 13A. The input voltage V1 increases and reaches the input voltage V2, and, thereafter, if the clock signal CP1 shown in FIG. 13B is at a low level, the input voltage V1 becomes higher than the input voltage V2. However, if the clock signal CP1 is at a high level, the input voltage V2 increases together with the input voltage V1. When the clock signal CP2 becomes high, as shown in FIG. 13C, and if the fact that the input voltage V1 is higher than the input voltage V2 is detected, the sense amplifier 30 supplies a data signal of logic level "1". In response to this data signal, the latch circuit 40 latches the data of logic level "1" and generates a signal of high level as shown in FIG. 13D. Thereafter, the input voltage V1 is set at the maximum voltage level V1H, and the input voltage V2 is set at a voltage level which is lower than the voltage level V1 by a predetermined voltage. When the data signal from the data transmission circuit 18 changes toward a low level, the input voltage V1 falls and becomes lower than the input voltage V2. Upon detection of the input voltage V2 being higher than the input voltage V1 in response to the clock signal CP2, the sense amplifier 30 generates a data signal of logic level "0". In response to the data signal of logic level "0", the latch circuit 40 latches data "0" and generates a signal of low level.

Figure 14:
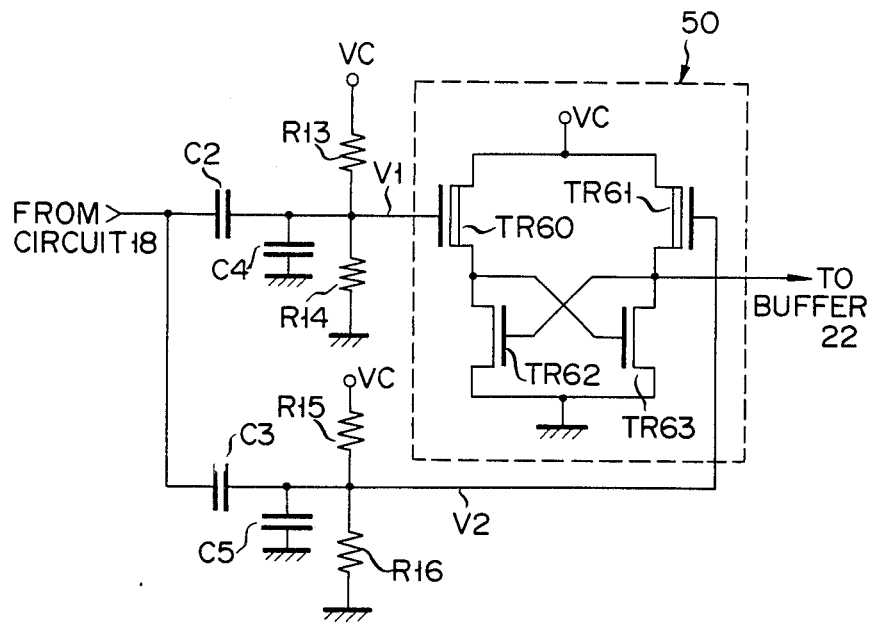
FIG. 14 is a circuit diagram of a data readout section of a semiconductor memory device according to still another embodiment of the present invention.

FIG. 14 shows a circuit diagram of a data readout section of a semiconductor memory according to still another embodiment of the present invention. In this embodiment, the output terminal of the data transmission circuit 18 (FIG. 3) is coupled to the first and second input terminals of a differential sense amplifier 50 through capacitors C2 and C3, respectively. One end of the capacitor C2 is grounded through a capacitor C4, coupled to a power source terminal VC through a resistor R13, and grounded through a resistor R14. One end of the capacitor C3 is grounded through a capacitor C5, coupled to the power source terminal VC through a resistor R15, and grounded through a resistor R16.

The sense amplifier 50 includes input MOS transistors TR60 and TR61 and drive MOS transistors TR62 and TR63.

The capacitances of the capacitors C2 to C5 are set to satisfy the relations C2=C3 and C4<C5, and the resistances of the resistors R13 to R16 are set so as to satisfy the relations R13/R14=R15/R16.

Figure 15A:
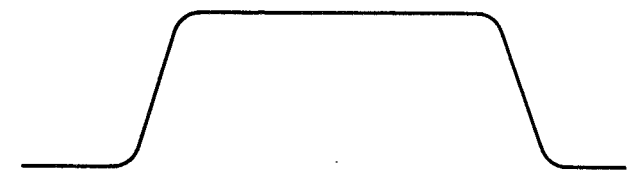
FIGS. 15A to 15C show signal waveforms for explaining the operation of the data readout section shown in FIG. 14.
Figure 15B:
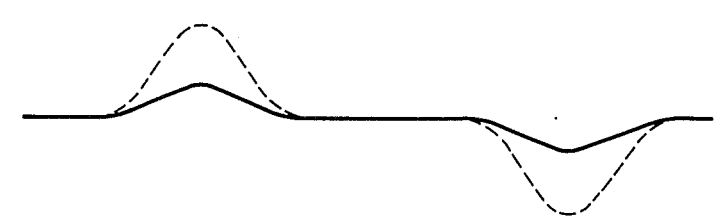
Figure 15C:

A case will now be described wherein the data signal from the data transmission circuit 18 decreases or increases, as shown in FIG. 15A. When the data signal from the data transmission circuit 18 is at a low level, the input voltages V1 and V2 are held at a constant voltage level VX which is determined by resistors R13 and R14 and resistors R15 and R16, respectively, as shown in FIG. 15B. When the data signal from the data transmission circuit 18 then increases, the input voltages V1 and V2 increase at different rates as indicated by the broken and solid lines, respectively, in FIG. 15B. That is, since the capacitor C4 has a smaller capacitance than the capacitor C5, the input voltage V1 increases at a greater rate than that of the input voltage V2. Then, a voltage difference is established between the input voltages V1 and V2, and the sense amplifier 30 detects this voltage difference. The sense amplifier 30 then generates a data signal of high level as shown in FIG. 15C. Then, when the data signal from the data transmission circuit 18 further increases and stabilizes at a high level, the input voltages V1 and V2 both return to the constant voltage level VX. In this case, the sense amplifier 50 serves as a flip-flop circuit and continues generating a data signal of high level even when the input voltages V1 and V2 are kept at the constant voltage level VX.

When the data signal decreases as shown in FIG. 15A, the input voltage V1 decreases at a greater rate than the input voltage V2, as shown in FIG. 15B. The sense amplifier 50 then detects this voltage difference between the input voltages V1 and V2, and generates a data signal of low level as shown in FIG. 15C.

In this embodiment, when the data signal from the data transmission circuit 18 starts changing, the sense amplifier 50 generates a data signal corresponding to the difference between the input voltages V1 and V2. In this manner, the memory data from a memory section 10 (FIG. 3) may be read out at high speed.

Figure 16:
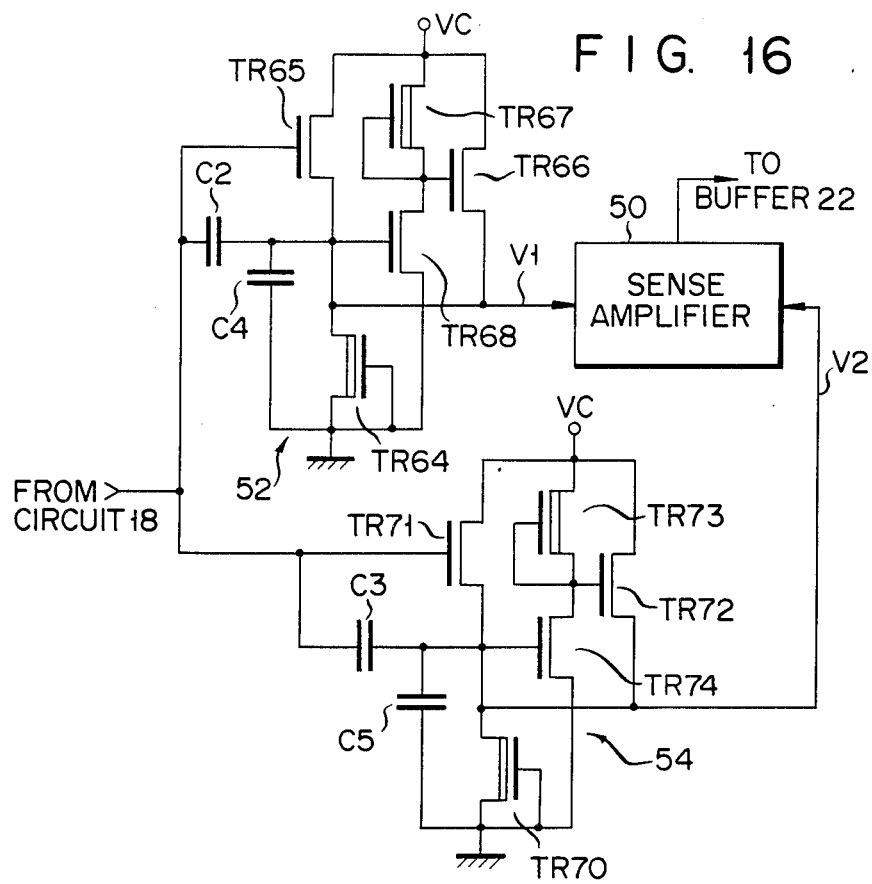
FIG. 16 is a circuit diagram of a data readout section of a semiconductor memory device according to still another embodiment of the present invention.

FIG. 16 shows a circuit diagram of a data readout section of a semiconductor memory device according to still another embodiment of the present invention. The circuit of this embodiment has first and second voltage supply circuits 52 and 54 which respectively have capacitors C2 and C3 coupled to the output terminal of the data transmission circuit 18, and which supply the first and second input voltages V1 and V2, respectively, to a differential sense amplifier 50. One end of the capacitor C2 is grounded through a capacitor C4, and is also grounded through an MOS transistor TR64. MOS transistors TR65 and TR66 are connected in parallel with each other between the MOS transistor TR64 and a power source terminal VC. A series circuit of MOS transistors TR67 and TR68 is connected between the power source terminal VC and ground. The gate of the MOS transistor TR65 is connected to the other end of the capacitor C2, the gates of the MOS transistors TR66 and TR67 are respectively connected to the connection point between the MOS transistors TR67 and TR68, and the gate of the MOS transistor TR68 is connected to the one end of the capacitor C2. The second voltage supply circuit 54 has a capacitor C5 and MOS transistors TR70 to TR74 which are connected in the same manner as the capacitor C4 and the MOS transistors TR64 to TR68. The MOS transistors TR64, TR67, TR70 and TR73 are of D-type.

Figure 17A:
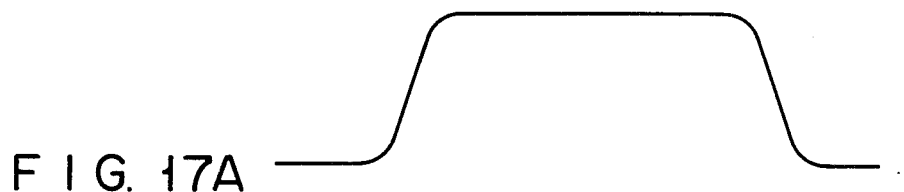
FIGS. 17A to 17C show signal waveforms for explaining the operation of the data readout section shown in FIG. 16.
Figure 17B:
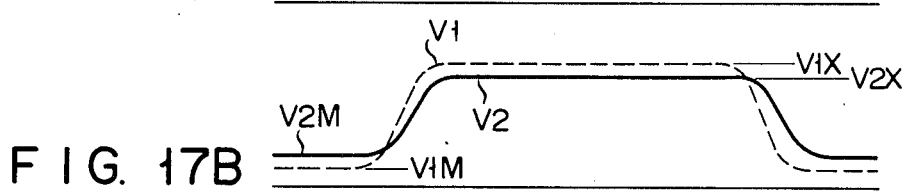

A case will now be considered wherein a data signal of low level is generated from the data transmission circuit 18, as shown in FIG. 17A. In this case, the MOS transistors TR65 and TR71 are OFF, and the capacitors C4 and C5 discharge through the MOS transistors TR64 and TR70. Therefore, the MOS transistors TR68 and TR74 are OFF. Thus, the first input voltage V1 is set at a voltage level V1M which is determined by the ratio of conduction resistances R66 and R64 of the MOS transistors TR66 and TR64, respectively, and the input voltage V2 is set at a voltage level V2M which is determined by the ratio of conduction resistances R72 and R70 of the MOS transistors TR72 and TR70, respectively. Note that the resistances R64, R66, R70 and R72 are set such that the voltage level V1M is lower than the voltage level V2M, as shown in FIG. 17B.

Figure 17C:

When the data signal from the data transmission circuit 18 increases thereafter, since the capacitor C2 is designed in the same manner as in the former embodiment, the input voltage V1 increases at a greater rate than the input voltage V2. Upon detection of the input voltage V1 exceeding the input voltage V2, the sense amplifier 50 generates a signal of high level as shown in FIG. 17C. When the data signal from the data transmission circuit 18 is set at a high level, the MOS transistors TR65 and TR71 are turned on. In this state, the first input voltage V1 is set at a voltage level V1X which is determined by the ratio of the conduction resistances R65 and R64 of the MOS transistors TR65 and TR64, respectively, and the second input voltage V2 is set at a voltage level V2X which is determined by the ratio of the conduction resistances R71 and R70 of the MOS transistors TR71 and TR70, respectively. Note that the resistances R64, R65, R70 and R71 are set such that the voltage level V1X is higher than the voltage level V2X, as shown in FIG. 17B.

When the data signal from the data transmission circuit 18 decreases again thereafter, the first input voltage V1 decreases at a greater rate than the second input voltage V2. Upon detecting that the first input voltage V1 is lower than the second input voltage V2, the sense amplifier 40 generates a low level signal as shown in FIG. 17C.

Figure 18:
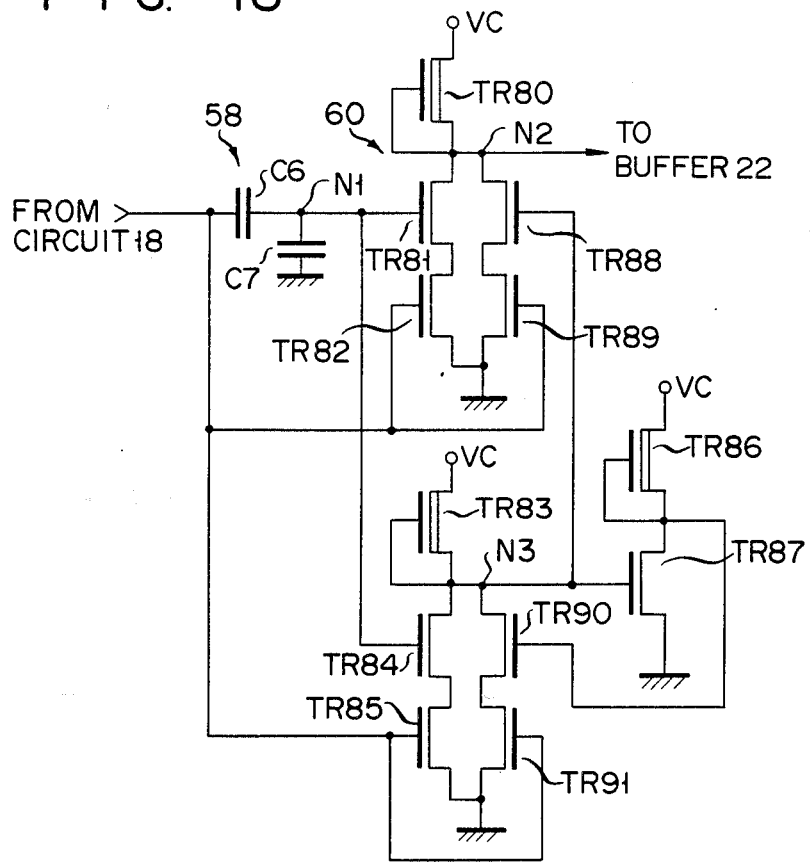
FIG. 18 is a circuit diagram of a data readout section of a semiconductor memory device according to still another embodiment of the present invention.

FIG. 18 shows a circuit diagram of a semiconductor memory device according to still another embodiment of the present invention, the circuit diagram particularly showing a differential voltage generator 58 and a differential sense amplifier 60. The differential voltage generator 58 has capacitors C6 and C7 which are series-connected between ground and the output terminal of the data transmission circuit 18. When the data signal from the data transmission circuit 18 changes, the differential voltage generator 58 generates, at a node N1 between the capacitors C6 and C7, a voltage signal which changes such that a voltage difference between the voltage signal and the data signal gradually becomes large.

The sense amplifier 60 includes a series circuit of MOS transistors TR80, TR81 and TR82 and another series circuit of MOS transistors TR83, TR84 and TR85, which are coupled between ground and the power source terminal VC, and MOS transistors TR86 and TR87 constituting an inverter. A series circuit of MOS transistors TR88 and TR89 is connected between ground and a node N2 between the MOS transistors TR80 and TR81, and a series circuit of MOS transistors TR90 and TR91 is connected between ground and a node N3 between the MOS transistors TR83 and TR84.

Figure 19A:
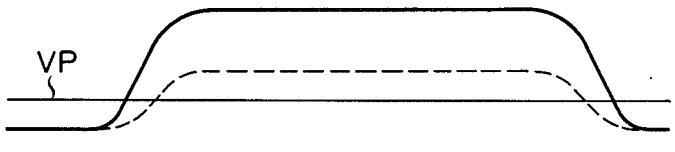
FIGS. 19A to 19C show signal waveforms for explaining the operation of the data readout section shown in FIG. 18.
Figure 19B:
Figure 19C:

When a data signal DS from the data transmission circuit 18 (FIG. 3) is at a low level, as shown in FIG. 19A, the MOS transistors TR82, TR89 and TR91 are OFF, and the MOS transistor TR87 is ON. Then, the potentials at the nodes N2 and N3 become high as shown in FIGS. 19B and 19C, respectively. As the data signal from the data transmission circuit 18 increases thereafter, the potential at the node N1 also increases with an increase in the data signal, as indicated by the broken line shown in FIG. 19A. When the data signal DS reaches a predetermined voltage VP, the MOS transistor TR89 is turned on. In this case, since the MOS transistor TR88 is already ON, the potential at the node N2 is set at a low level as shown in FIG. 19C. In this case, when the data signal from the data transmission circuit 18 reaches the predetermined potential VP, an output data signal corresponding to the memory data is supplied to the output buffer circuit 22. When the potential at the node N1 reaches the predetermined voltage level VP thereafter, the MOS transistors TR81 and TR84 are turned on. Then, the potential at the node N2 is held at a low level, and the potential at the node N3 becomes low as shown in FIG. 19B. Thereafter, when the data signal DS reaches a high level, the potential at the node N1 is set at a voltage level which is determined in accordance with the ratio of the capacitances of the capacitors C6 and C7.

When the data signal DS changes toward a low level, and the potential at the node N1 reaches the predetermined potential level VP, the MOS transistor TR81 is turned off. In this case, since the MOS transistor TR88 is already OFF, the potential at the node N2 becomes high as shown in FIG. 19C. That is, as the data signal DS changes from the high to low level when the potential at the node N2 reaches the predetermined voltage level VP, an output data signal corresponding to the memory data is supplied to the output buffer circuit 22. Thus, the memory data may be read out at a high speed. Note that when the data signal DS reaches the predetermined voltage level VP, the potential at the node N3 becomes high as shown in FIG. 19B.

Figure 20:
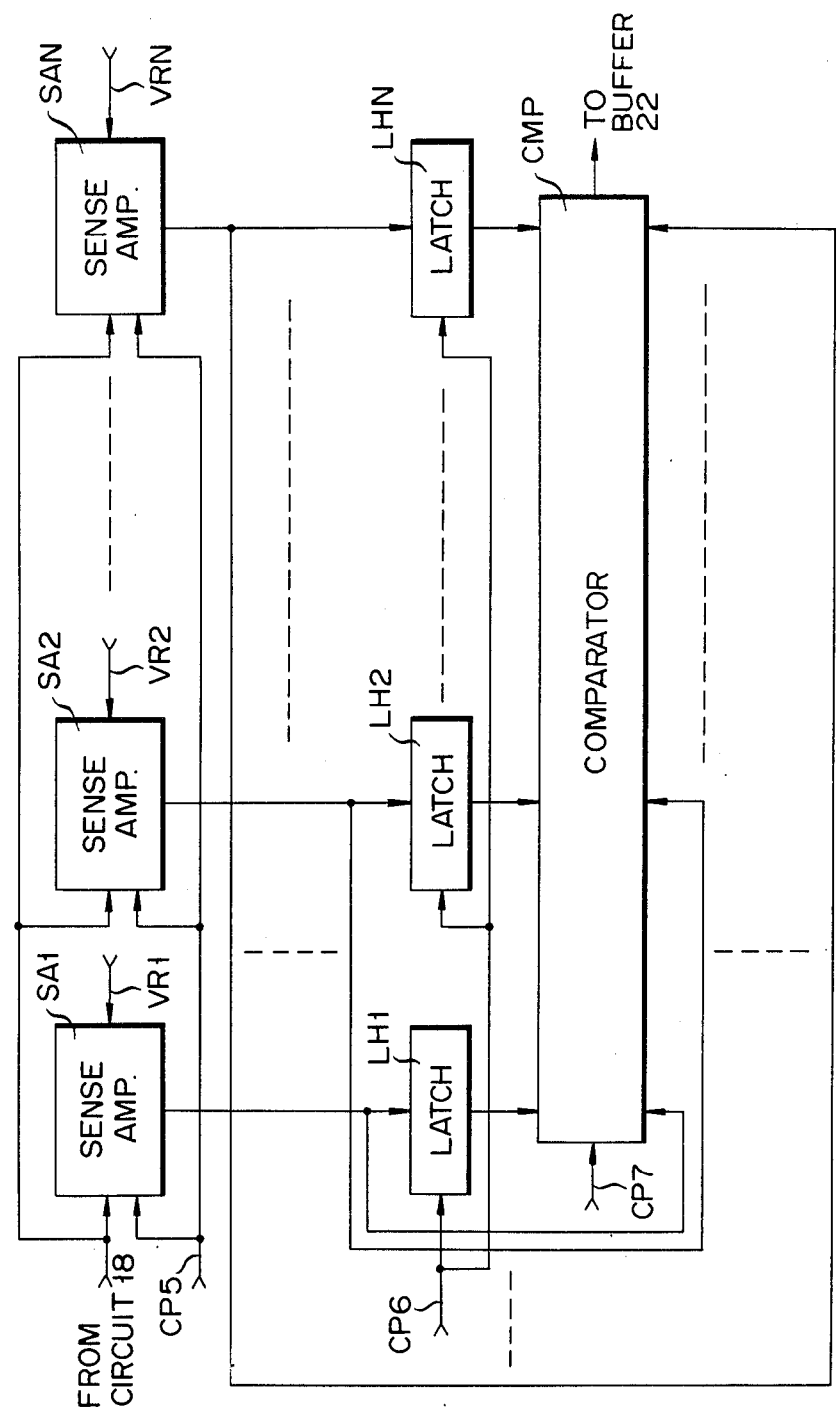
FIG. 20 is a block diagram of a data readout section of a semiconductor memory device according to still another embodiment of the present invention.

FIG. 20 is a circuit diagram of a semiconductor memory device according to still another embodiment of the present invention. The device includes differential sense amplifiers SA1 to SAN which detect the differences between a data signal from the data transmission circuit 18 and respective reference voltages VR1 to VRN, and which supply output signals respectively corresponding to these voltage differences to latch circuits LH1 to LHN; and a comparator CMP for comparing the output signals from the sense amplifiers SA1 to SAN with the output signals from the latch circuits LH1 to LHN.

Figure 21:
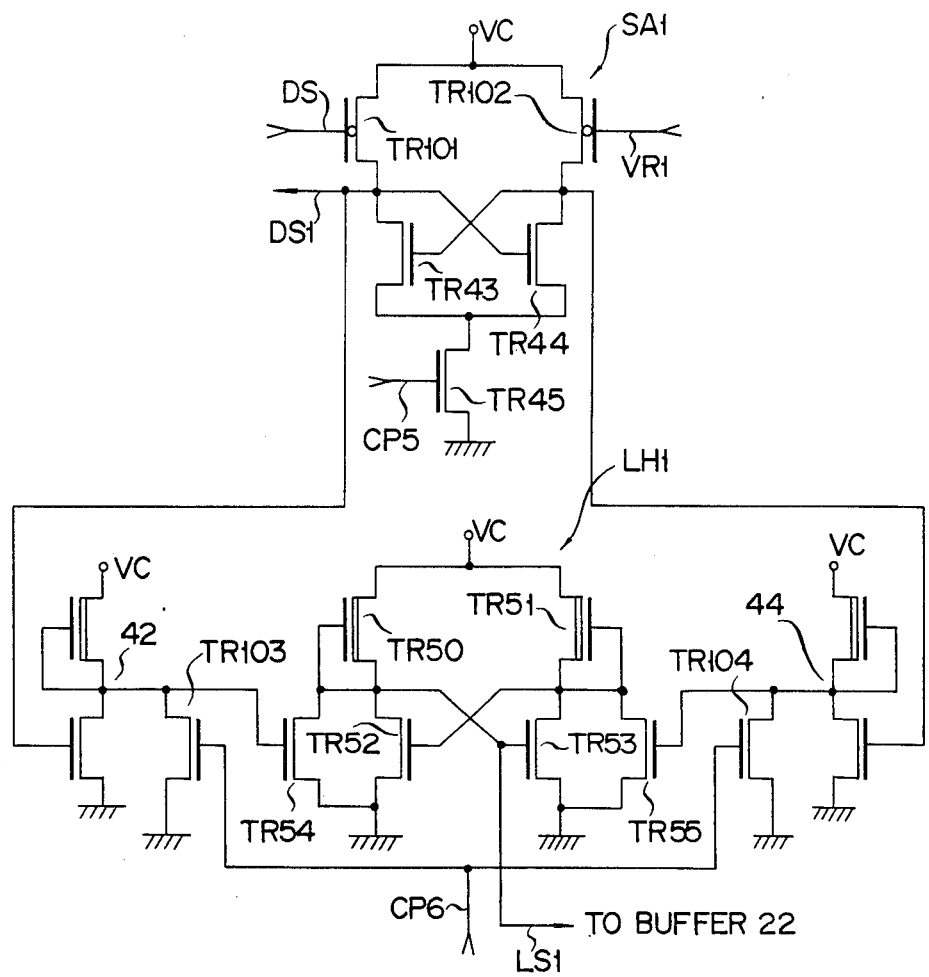
FIG. 21 is a circuit diagram of the sense amplifier and a latch circuit shown in FIG. 20.

FIG. 21 is a detailed circuit diagram of the sense amplifier SA1 and the latch circuit LH1 shown in FIG. 20. The remaining sense amplifiers SA2 to SAN and latch circuits LH2 to LHN are of similar configuration. The sense amplifier SA1 is similar to the sense amplifier 30 shown in FIG. 1 except that the MOS transistors TR41 and TR42 are replaced by MOS transistors TR101 and TR102 which have a threshold voltage of about 0 V. The latch circuit LH1 has a latch circuit 40 and inverters 42 and 44 as shown in FIG. 11, a MOS transistor TR103 coupled between ground and the gate of the MOS transistor TR54, and a MOS transistor TR104 coupled between ground and the gate of the MOS transistor TR55. A clock signal CP5 is supplied to the gate of the MOS transistor TR45, while a clock signal CP6 is supplied to the gates of the MOS transistors TR103 and TR104.

FIG. 22 is a detailed circuit diagram of the comparator CMP shown in FIG. 20. The comparator CMP includes a first voltage generator 70 for generating a first input voltage V11 in response to data signals DS1 to DSN from the sense amplifiers SA1 to SAN, and a second voltage generator 72 for generating a second input voltage V22 in response to the output signals LS1 to LSN from the latch circuits LH1 to LHN. The second voltage generator 72 includes N resistors R72-1 to R72-N and a switching MOS transistor TR110 series-connected between the power source terminal VC and ground. The nodes between the MOS transistor TR110 and the resistors R72-1 to R72-N are respectively connected to the power source terminal VC through a series-circuit of one of the resistors R72-(N+1) to R72-2N and a corresponding one of MOS transistors TR72-1 to TR72-N. The resistors R72-1 to R72-(N+1) have a resistance R, while the remaining resistors have a resistance of 2R. The first voltage generator 70 has resistors R70-1 to R70-2N which are connected in the same manner as the resistors R72-1 to R72-2N, and MOS transistors TR70-1 to TR70-N which are connected in the same manner as the MOS transistors TR72-1 to TR72-N. In the first voltage generator 70, the resistor R70-2N, one end of which is connected to the power source terminal VC through the MOS transistor TR70-N and the other end of which is grounded through the resistor R70-N, has a resistance R. Output signals DS1 to DSN from the sense amplifiers SA1 to SAN are supplied to the gates of the MOS transistors TR70-1 to TR70-N, and output signals LS1 to LSN from the latch circuits LH1 to LHN are supplied to the gates of the MOS transistors TR72-1 to TR72-N.

The comparator CMP further has a differential sense amplifier 74, a latch circuit 76, and inverters 78 and 80 which have similar configurations to those of the sense amplifier 30, the latch circuit 40 and the inverters 42 and 44 shown in FIG. 11.

Figure 23A:
Figure 23B:
Figure 23C:

FIGS. 23A to 23C show the waveforms of clock signals CP5, CP6 and CP7 which are respectively supplied to the sense amplifiers SA1 to SAN, the latch circuits LH1 to LHN, and the comparator CMP. As shown in FIG. 23A, when the clock signal CP5 is at a high level, the sense amplifiers SA1 to SAN generate data signals DS1 to DSN. When the clock signal CP6 shown in FIG. 23B is at a low level, the data signals DS1 to DSN are respectively latched in the latch circuits LH1 to LHN. The data signals LS1 to LSN which are thus latched in the latch circuits LH1 to LHN are compared with the data signals from the sense amplifiers SA1 to SAN when the clock signal CP7 becomes high as shown in FIG. 22.

For example, a case will be considered wherein the data signal DS from the data transmission circuit 18 increases and then decreases as shown in FIG. 24A. When the data signal DS is at a low level, the sense amplifiers SA1 to SAN and the latch circuits LH1 to LHN generate signals DS1 to DSn and LS1 to LSn having a logic level "0". Therefore, in this state, the first voltage generator 70 generates a voltage lower than that of the second voltage generator 72, and the comparator CMP supplies an output signal of constant level shown in FIG. 24C to the output buffer circuit 22 irrespective of the clock signal CP7 shown in FIG. 24B. Then, when the data signal DS increases, and only the output signal DS1 from the sense amplifier SA1 is set at a logic level "1", the MOS transistor TR70-1 is turned on. The first voltage generator 70 then generates a voltage higher than that of the second voltage generator 72. In response to the clock signal CP7, the comparator CMP generates an output signal of high level. Even if the data signal DS becomes higher than the reference voltage VRN thereafter, the first voltage generator 70 keeps generating a voltage higher than that of the second voltage generator 72, and the comparator CMP keeps generating an output signal of high level. When the data signal DS becomes lower than the reference voltage VRN, only the output signal DSN from the sense amplifier SAN is set at a logic level "0". The MOS transistor TR70-N is turned off, and the first voltage generator 70 generates a voltage lower than that of the second voltage generator 72. In response to the clock signal CP7, the comparator CMP generates a low level output signal as shown in FIG. 24C. Even if the data signal DS becomes lower than the reference voltage VR1 thereafter, the first voltage generator 70 keeps generating a voltage lower than that of the second voltage generator 72, and the output signal from the comparator CMP is kept at a low level.

In this embodiment, the number of signals of logic level "1" which are included in the output signals from the sense amplifiers SA1 to SAN and the number of signals of logic level "1" which are included in the output signals from the latch circuits LH1 to LHN may be compared so as to determine whether the data signal DS from the data transmission circuit 18 is increasing or decreasing, and the memory data may be read out at a high speed.

FIGS. 25 and 26 show modifications of the first voltage generator 70, shown in FIG. 22. In the modification shown in FIG. 25, an MOS transistor is used in place of each of the resistors R70-1 to R70-N, and the resistors R70-(N+1) to R70-2N are omitted. Of the MOS transistors TR70-1 to TR70-N, the MOS transistors TR70-1 and TR70-N have a resistance R and the remaining MOS transistors have a resistance 2R in the ON state.

In the modification shown in FIG. 26, the resistors R70-1 to R70-2N are omitted, and one end of each of the MOS transistors TR70-1 to TR70-N is grounded through an MOS transistor TR74 replacing the resistor R70-N. In this first voltage generator as well, the conduction resistance of the MOS transistor TR70-N is designed to be half that of the remaining resistors. When a first voltage generator as shown in FIGS. 25 or 26 is used, it is preferable that the second voltage generator 72 also be modified as shown in FIGS. 25 or 26.

Figure 27:
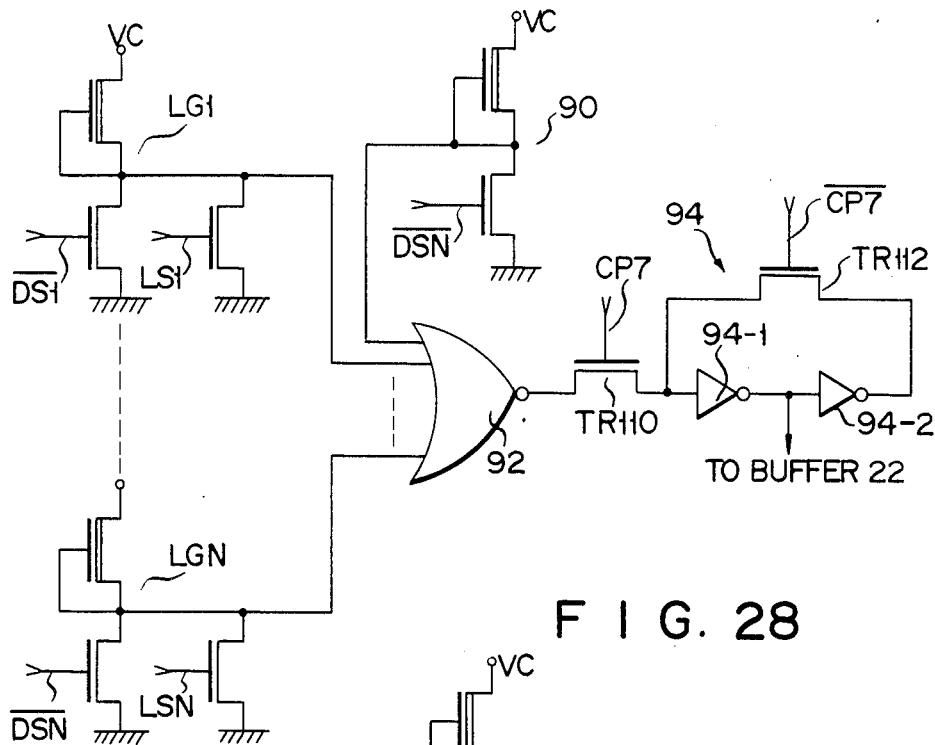
FIG. 27 shows another configuration of the comparator shown in FIG. 20.

FIG. 27 shows another example of the comparator CMP shown in FIG. 20. The comparator CMP has N logic circuits LG1 to LGN, a NOR gate 92 for receiving output signals from the logic circuits LG1 to LGN and an inverter 90, and a latch circuit 94. Each of the logic circuits LG1 to LGN is a NOR gate circuit including a D-type MOS transistor, and two E-type MOS transistors connected between this D-type MOS transistor and ground. An inverted signal of the output signal from a corresponding one of the sense amplifiers SA1 to SAN and an output signal from a corresponding one of the latch circuits LH1 to LHN are supplied to the gates of the two E-type MOS transistors of each of the logic circuits LG1 to LGN. The inverter 90 receives a data signal $\overline{DSN}$. The latch circuit 94 has switching MOS transistors TR110 and TR112, and inverters 94-1 and 94-2 which are coupled between the two ends of the MOS transistor TR112.

When the number of signals of logic level "1" among the output signals from the sense amplifiers SA1 to SAN is greater than that from the latch circuits LH1 to LHN, at least one of the logic circuits LG1 to LGN supplies a signal of logic level "1" to the NOR gate 92. In response to the clock signal CP7, the latch circuit 94 latches the signal of logic level "1" from the NOR gate 92. However, when the number of signals of logic level "1" among the output signals DS1 to DSN is smaller than that among the latch signals LS1 to LSN or is zero, all of the logic circuits LG1 to LGN produce signals of logic level "0". In this case, in response to the clock signal CP7, the latch circuit 94 latches the signal of logic level "0" from the NOR gate 92. When a signal of logic level "1" is generated from the sense amplifier SAN, a signal of logic level "1" is generated by the inverter 90 and is latched in the latch circuit 94.

Figure 28:
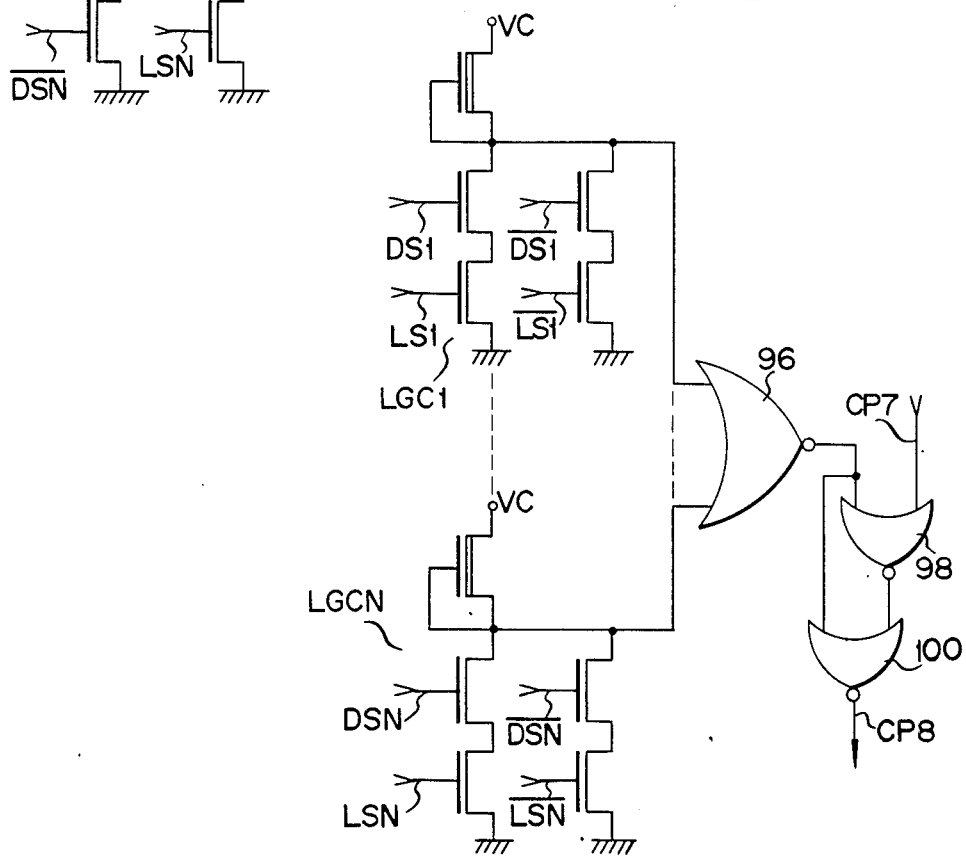
FIG. 28 is a circuit diagram of a clock signal generator for generating a clock signal for driving the latch circuit of the comparator shown in FIG. 27.

FIG. 28 shows a clock signal generator which generates a clock signal CP8 used in place of the clock signal CP7 so as to drive the latch circuit 94. The clock signal generator has N logic gate circuits LGC1 to LGCN, a NOR gate 96 coupled to these logic gate circuits LGC1 to LGCN, a NOR gate 98 for receiving the output signal from the NOR gate 96 and the clock signal CP7, and a NOR gate 100 for receiving the output signals from the NOR gates 96 and 98.

Each of the logic gate circuits LGC1 to LGCN has a load MOS transistor and two sets of series circuits each formed of two E-type MOS transistors and connected between the load MOS transistor and ground. The two MOS transistors of one series circuit receive a corresponding one of the data signals DS1 to DSN and a corresponding one of the latch signals LS1 to LSN, while the two MOS transistors of the other series circuit receive inverted signals of the corresponding data signal and the corresponding latch signal.

When the data signals DS1 to DSN and the latch signals LS1 to LSN are equal, the NOR gate 100 generates a signal CP8 of logic level "0", and the comparator shown in FIG. 7 receives the signal latched in the latch circuit 94. On the other hand, when the data signals DS1 to DSN and the latch signals LS1 to LSN are different from each other, the NOR gate 96 generates a signal of logic level "0", and the clock signal CP7 is generated as a clock signal CP8 through the NOR gates 98 and 100.

In a case where the clock signal CP8 from the clock signal generator shown in FIG. 28 is used in place of the clock signal CP7 in the comparator shown in FIG. 27, the latch circuit 94 holds the latched content while the data signal DS is kept at a low or high level. Accordingly, the inverter 90 may be omitted in the comparator shown in FIG. 27.

FIG. 29 shows a circuit diagram of part of a semiconductor memory device according to still another embodiment of the present invention. The device has differential sense amplifiers SA1 to SA3 which detect the voltage differences between the data signal DS from the data transmission circuit 18 and reference voltages VR1 to VR3 having different voltage levels, and which supply output signals corresponding to these voltage differences to a logic circuit 120. When the data signal DS from the data transmission circuit 18 is at a level higher than the corresponding reference voltage VR1, VR2 or VR3, it produces an output signal D1, D2 or D3 of logic level "1".

Figure 30:
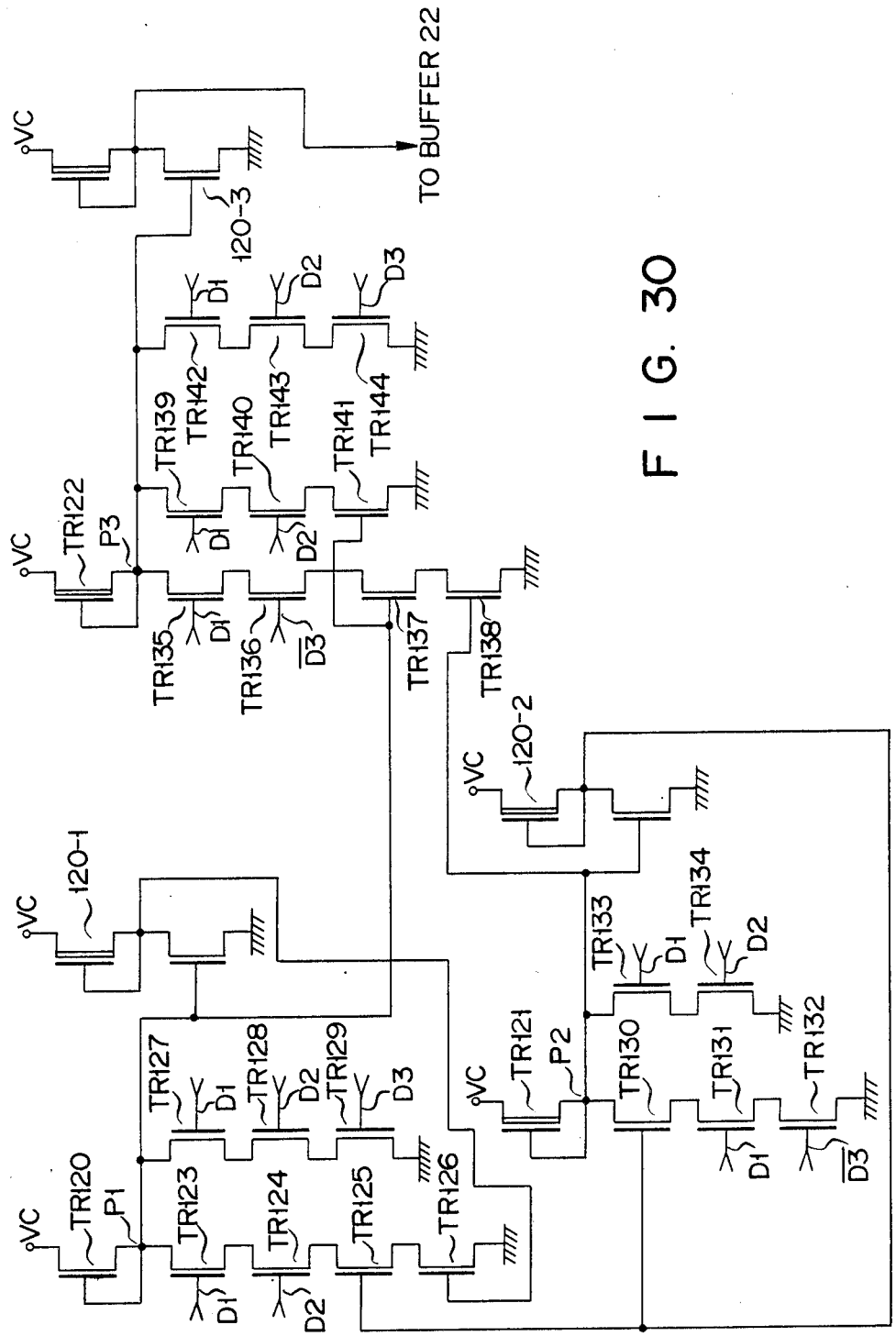
FIG. 30 is a detailed circuit diagram of the logic circuit shown in FIG. 29.
Figure 31:
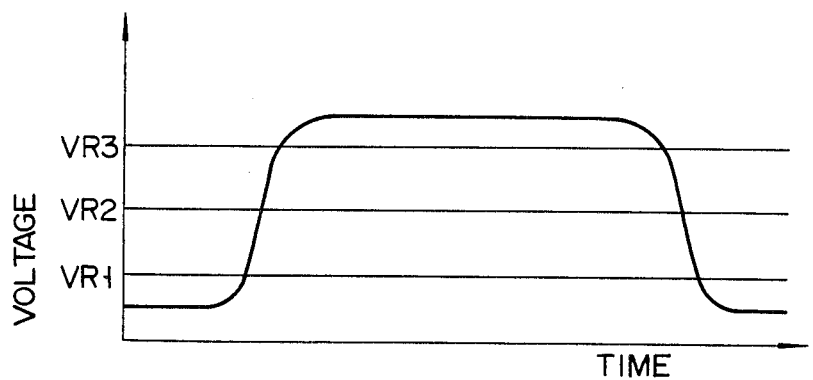
FIG. 31 shows a signal waveform for explaining the operation of the data readout section shown in FIG. 30.

FIG. 30 shows a detailed circuit diagram of the logic circuit 120. The logic circuit 120 has load MOS transistors TR120 to TR122, one end of each of which is connected to a power source terminal VC; a series circuit of MOS transistors TR123 to TR126 and a series circuit of MOS transistors TR127 to TR129, which are connected between the other end P1 of the MOS transistor TR120 and ground; a series circuit of MOS transistors TR130 to TR132 and a series circuit of MOS transistors TR133 and TR134, which are coupled between the other end P2 of the MOS transistor TR121 and ground; and a series circuit of MOS transistors TR135 to TR138, a series circuit of MOS transistors TR139 to TR141, and a series circuit of MOS transistors TR142 to TR144, which are coupled between the other end P3 of the MOS transistor TR122 and ground.

The gates of the MOS transistors TR123, TR127, TR131, TR133, TR135, TR139 and TR142 receive an output signal D1 from the sense amplifier SA1; the gates of the MOS transistors TR124, TR128, TR134, TR140 and TR143 receive an output signal D2 from the sense amplifier SA2; the gates of the MOS transistors TR129 and TR144 receive an output signal D3 from the sense amplifier SA3; and the gates of the MOS transistors TR132 and TR136 receive an inverted output signal $\overline{D3}$.

The other end of the MOS transistor TR120 is coupled to the gate of the MOS transistor TR126 through an inverter 120-1 and is directly coupled to the gates of the MOS transistors TR137 and TR141. The other end of the MOS transistor TR121 is coupled to the gate of the MOS transistor TR138, and is coupled to the gates of the MOS transistors TR125 and TR130 through an inverter 120-2. The other end of the MOS transistor TR122 is coupled to the output buffer circuit 22 through an inverter 120-3.

A case will now be considered wherein a data signal DS from the data transmission circuit 18 increases from a voltage level lower than a reference voltage level VR1 to a voltage level higher than a reference voltage level VR3, and then decreases again to a voltage level lower than the reference voltage VR1. In this case, in accordance with changes in the data signal DS, the output signals D1 to D3 from the sense amplifiers SA1 to SA3 and those at the points P1 to P3 change as shown in Table 1 below:

TABLE 1

| DS | I | II | III | IV | V | VI | VII |
|---|---|---|---|---|---|---|---|
| D1 | 0 | 1 | 1 | 1 | 1 | 1 | 0 |
| D2 | 0 | 0 | 1 | 1 | 1 | 0 | 0 |
| D3 | 0 | 0 | 0 | 1 | 0 | 0 | 0 |
| P1 | 1 | 1 | 1 | 0 | 0 | 1 | 1 |
| P2 | 1 | 1 | 0 | 0 | 0 | 0 | 1 |
| P3 | 1 | 0 | 0 | 0 | 1 | 1 | 1 |

As is clearly seen in Table 1 above, the data signal DS takes the following states:

(I) When the data signal DS is lower than the reference voltage VR1, all the signals D1 to D3 are set at a logic level "0", and the potential levels at the points P1 to P3 are all set at a logic level "1".

(II) When the data signal DS increases and reaches a level higher than the reference voltage VR1, the signal D1 is held at a logic level "1", and the signals D2 and D3 are held at a logic level "0". Then, the potentials at the points P1 and P2 are held at a logic level "1", while the potential at the point P3 is held at a logic level "0".

(III) When the data signal DS further increases and reaches a level higher than the reference voltage VR2, the signals D1 and D3 are held at logic levels "1" and "0", respectively, and the signal D2 is held at a logic level "1". Then, the potentials at the points P1 and P3 are held at logic levels "1" and "0", respectively, and the potential at the point P2 is held at a logic level "0".

(IV) When the data signal DS further increases and reaches a level higher than the reference voltage VR3, all the signals D1 to D3 are held at a logic level "1", and the potentials at the points P1 to P3 are held at a logic level "0".

(V) When the data signal DS decreases and becomes lower than the voltage VR3 thereafter, the signal D3 is held at a logic level "0", and the potential at the point P3 is held at a logic level "1".

(VI) When the data signal DS further decreases and becomes lower than the voltage VR2, the signals D2 and D3 are held at a logic level "0". Then, the potential at the point P1 is held at logic level "1", and the potentials at the points P2 and P3 are held at logic levels "0" and "1", respectively.

(VII) When the data signal DS then becomes lower than the voltage VR1, all the signals D1 to D3 are held at a logic level "0", and all the potentials at the points P1 to P3 are held at a logic level "1".

In this manner, in this embodiment, when the data signal DS increases from the low level and exceeds the voltage VR1, or decreases from the high level and becomes lower than the voltage VR3, the memory data is read out. When the data signal DS increases and reaches a level (state III) higher than the voltage VR2 and then becomes lower than the voltage VR2 (state VI), the potential at the point P3 changes to a logic level "1" and the memory data is read out.

Although the present invention has been described with reference to the particular embodiments mentioned, it is not limited to these embodiments. For example, in the embodiments described above, the memory section 10 is formed of a ROM. However, a RAM may be used in place of the ROM. In this case, the data signals D and $\overline{D}$ are supplied to the two input terminals of the sense amplifier through a pair of digit lines. In the present invention, the memory data may be read out using only the data signal D. For example, in the embodiment shown in FIG. 3, if the memory section 10 includes a RAM and the data signal D is supplied to the sense amplifier 16 as the first input voltage V1, the memory data from the RAM may be read out at a high speed.

Figure 32:
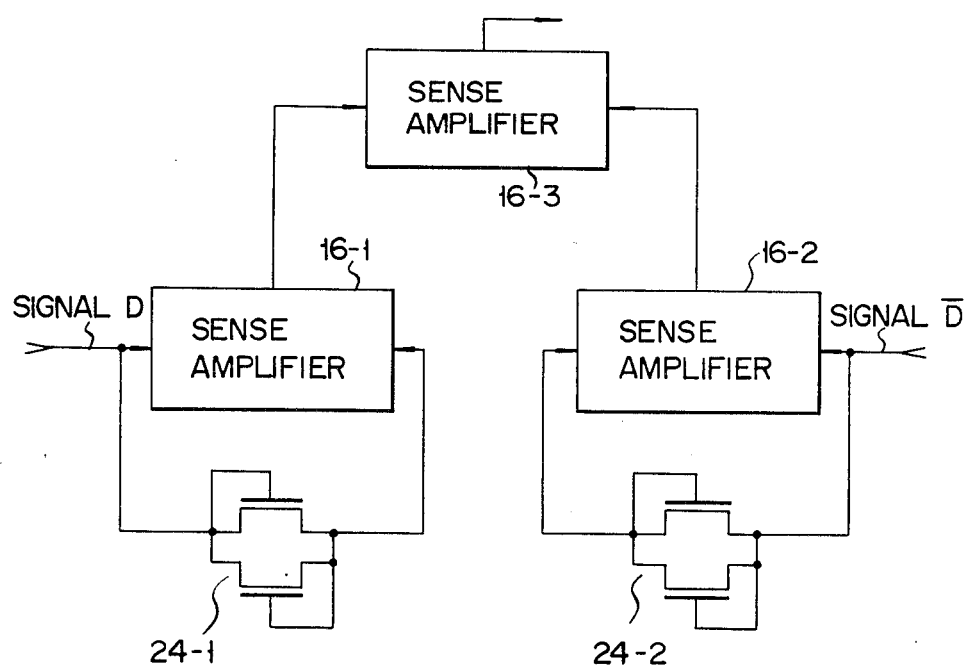
FIG. 32 is a block diagram of a ROM device according to still another embodiment of the present invention.

FIG. 32 shows a data readout section for reading out the memory data in accordance with the data signals D and $\overline{D}$ from a general ROM. The data readout section includes a differential sense amplifier 16-1 which receives at its first input terminal the data signal D and receives at its second input terminal the data signal D through a voltage difference generator 24-1, a differential sense amplifier 16-2 which receives at its first input terminal a data signal $\overline{D}$ and receives at its second input terminal the data signal $\overline{D}$ through a voltage difference generator 24-2, and a differential sense amplifier 16-3 which detects the voltage difference between the output signals from the sense amplifiers 16-1 and 16-2 and generates an output signal corresponding to the voltage difference. Each of the voltage difference generators 24-1 and 24-2 has a similar configuration to and operates in the same manner as the voltage difference generator 24 shown in FIG. 3.

As described with reference to the embodiment shown in FIG. 3, the sense amplifier 16-1 quickly detects an increase or decrease in the data signal D, and generates an output signal of logic level "1" or "0" in accordance with the detection result. The sense amplifier 16-2 quickly detects an increase or decrease in the data signal $\overline{D}$, and generates an output signal of logic level "1" or "0" in accordance with the detection result. The sense amplifier 16-3 generates an output signal corresponding to the voltage difference between the output signals from the sense amplifiers 16-1 and 16-2. Thus, in this embodiment, the memory data may be read out with higher reliability.

The memory section 10 may alternatively include an erasable and programmable (EP) ROM. In a floating-gate type EPROM, for example, data "0" or "1" is written in accordance with the injection of electrons in the floating gate. In this case, if the amount of electrons injected is small and the threshold voltage of the memory cell is set low, the readout data may not become sufficiently high and may not become higher than a specific reference potential, thereby causing erratic operation. However, in accordance with the present invention, since the memory data is read out in accordance with the level of the data signal, the probability of occurrence of such an erratic operation attributable to a change in the injection amount of electrons may be suppressed to the minimum.

In the embodiment shown in FIG. 11, it is possible to use the latch circuit 94 shown in FIG. 27 in place of the latch circuit 40, and to omit the inverters 42 and 44.

In the embodiments shown in FIGS. 14 and 16, similar effects may be obtained by omitting the capacitors C4 and C5 and setting the capacitance of the capacitor C2 higher than that of the capacitor C3. In the embodiment shown in FIG. 14, the capacitors C3 and C5 may be omitted so as to supply the voltage V2 determined by the resistors R15 and R16 to the sense amplifier 50.

In the embodiments shown in FIGS. 21 and 23, the clock signals CP5, CP6 and CP7 may be generated for a period in which the data signal is generated by the comparator CMP after the address is designated, as was described with reference to FIGS. 12A to 12D.

In FIGS. 6, 11 and 14, MOS transistors may be used in place of the resistors R7 to R16.

What is claimed is:

1. A semiconductor memory device comprising:
   memory means having a plurality of memory cells;
   data transmission means for transmitting data from said memory means;
   data detection means responsive to the data transmission means for producing output data in accordance with the change in logic level of the memory data;
   a sense amplifier circuit having a first input terminal and a second input terminal to receive data signals;
   data supplying means governed by the data transmission means for supplying a data signal, said data signal having a potential corresponding to a first and second preselected potential level, respectively;
   switching means operatively connected between the first and second input terminals of the sense amplifier to apply said data signal from the data supplying means to the first input terminal at times when said switching means is in its off condition and to the second input terminal at times when said switching means is in its on condition; and
   potential setting means for setting the second input terminal of said sense amplifier circuit to a third preselected potential level at times when said data signal is at the first preselected potential level and to a fourth preselected potential level when the data signal is at the second preselected potential level, the third preselected potential level having a value between the first and fourth preselected potential levels, and the fourth preselected potential level having a value between the second and third preselected potential levels.

2. A semiconductor memory device according to claim 1, wherein said potential setting means includes voltage storing means connected to the second input terminal of said sense amplifier circuit, means for discharging said voltage storing means to the third preselected potential level when said voltage storing means stores a voltage higher than the third preselected potential level and means for charging said voltage storing means to the fourth preselected potential level when said storing means stores a voltage lower than the fourth preselected potential level.

3. A semiconductor memory device according to claim 1, wherein said data supplying means further includes latch means for latching a data signal from said sense amplifier circuit.

4. A semiconductor memory device according to claim 1, wherein said switching means is a MOS transistor.

5. A semiconductor memory device according to claim 2, wherein said data supplying means further includes latch means for latching a data signal from said sense amplifier circuit.

6. A semiconductor memory device according to claim 2, wherein said switching means is a MOS transistor.

* * * * *